(12) United States Patent
Yeh et al.

(10) Patent No.: US 12,191,239 B2
(45) Date of Patent: *__Jan. 7, 2025__

(54) STACKED VIA STRUCTURE DISPOSED ON A CONDUCTIVE PILLAR OF A SEMICONDUCTOR DIE

(71) Applicant: Taiwan Semiconductor Manufacturing Company, Ltd., Hsinchu (TW)

(72) Inventors: Che-Yu Yeh, New Taipei (TW); Tsung-Shu Lin, Hsinchu (TW); Wei-Cheng Wu, Hsinchu (TW); Tsung-Yu Chen, New Taipei (TW); Li-Han Hsu, Hsin-Chu (TW); Chien-Fu Tseng, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/357,987

(22) Filed: Jul. 24, 2023

(65) Prior Publication Data
US 2023/0369189 A1    Nov. 16, 2023

Related U.S. Application Data

(63) Continuation of application No. 17/243,600, filed on Apr. 29, 2021, now Pat. No. 11,756,870.

(51) Int. Cl.
| | |
|---|---|
| *H01L 23/498* | (2006.01) |
| *H01L 23/00* | (2006.01) |
| *H01L 23/48* | (2006.01) |
| *H01L 25/065* | (2023.01) |

(52) U.S. Cl.
CPC ...... *H01L 23/49822* (2013.01); *H01L 23/481* (2013.01); *H01L 23/49816* (2013.01);
(Continued)

(58) Field of Classification Search
CPC ............. H01L 23/481; H01L 23/49816; H01L 23/49838; H01L 23/5389; H01L 24/25;
(Continued)

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

*Primary Examiner* — Khiem D Nguyen
(74) *Attorney, Agent, or Firm* — JCIPRNET

(57) ABSTRACT

A stacked via structure disposed on a conductive pillar of a semiconductor die is provided. The stacked via structure includes a first dielectric layer, a first conductive via, a first redistribution wiring, a second dielectric layer, a second conductive via, and a second redistribution wiring. The first dielectric layer covers the semiconductor die. The first conductive via is embedded in the first dielectric layer and electrically connected to the conductive pillar. The first redistribution wiring covers the first conductive via and the first dielectric layer. The second dielectric layer covers the first dielectric layer and the first redistribution wiring. The second conductive via is embedded in the second dielectric layer and landed on the first redistribution wiring. The second redistribution wiring covers the second conductive via and the second dielectric layer. A lateral dimension of the first conductive via is greater than a lateral dimension of the second conductive via.

20 Claims, 26 Drawing Sheets

(52) U.S. Cl.
CPC ........ *H01L 23/49838* (2013.01); *H01L 24/20* (2013.01); *H01L 24/24* (2013.01); *H01L 25/0652* (2013.01); *H01L 2224/2101* (2013.01); *H01L 2224/2105* (2013.01); *H01L 2224/214* (2013.01); *H01L 2224/24226* (2013.01); *H01L 2924/182* (2013.01)

(58) Field of Classification Search
CPC ....... H01L 25/105; H01L 24/20; H01L 24/24; H01L 23/49822; H01L 2224/2105; H01L 2225/1058
See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,269,773 B1* | 4/2019 | Yu | H01L 24/06 |
| 11,107,758 B2* | 8/2021 | Chiu | H01L 24/19 |
| 11,664,323 B2* | 5/2023 | Wang | H01L 25/16 |
| | | | 257/774 |
| 11,756,870 B2* | 9/2023 | Yeh | H01L 25/105 |
| | | | 257/774 |
| 2017/0032977 A1* | 2/2017 | Chen | H01L 23/5226 |
| 2019/0363063 A1* | 11/2019 | May | H01L 23/522 |
| 2020/0135631 A1* | 4/2020 | Seo | H01L 23/49822 |
| 2020/0203283 A1* | 6/2020 | Lee | H01L 21/565 |

\* cited by examiner

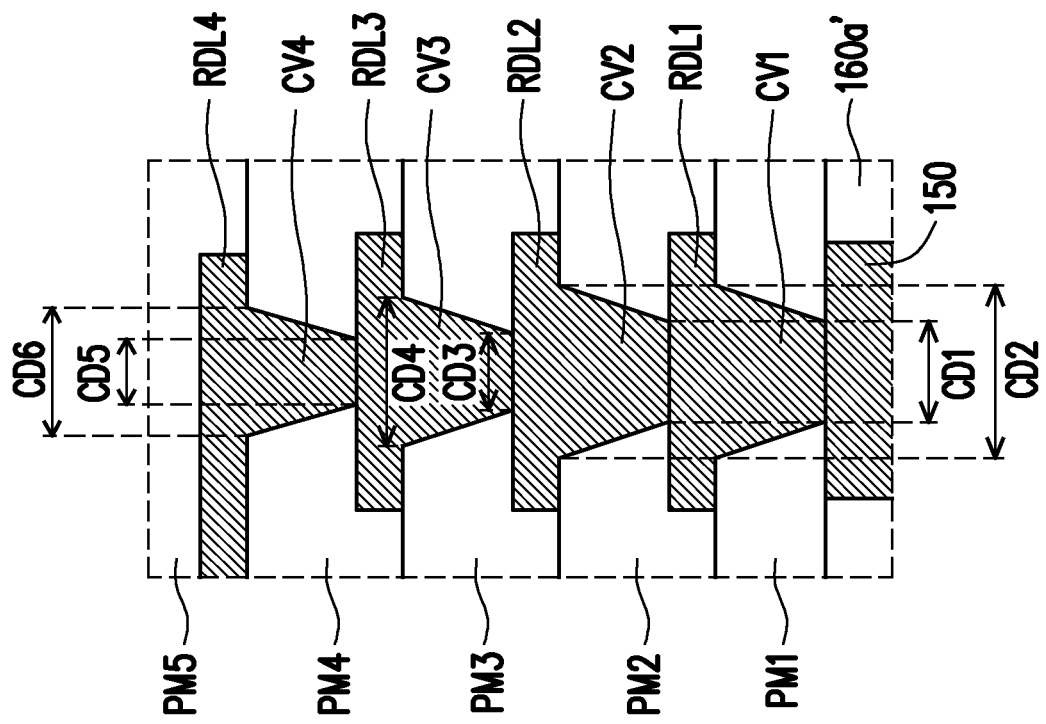

STACKED VIA STRUCTURE DISPOSED ON A CONDUCTIVE PILLAR OF A SEMICONDUCTOR DIE

CROSS-REFERENCE TO RELATED APPLICATION

This application is a continuation application of and claims the priority benefit of a prior application Ser. No. 17/243,600, filed on Apr. 29, 2021, issued as U.S. Pat. No. 11,756,870. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the reliability of the redistribution circuit structure fabricated on the molding compound is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17A, FIG. 17B, FIG. 17C, FIG. 18A, FIG. 18B, FIG. 18C, and FIG. 19 are enlarged views of the region X illustrated in FIG. 16 in accordance with various embodiments of the present disclosure.

DETAILED DESCRIPTION

Figure 1:
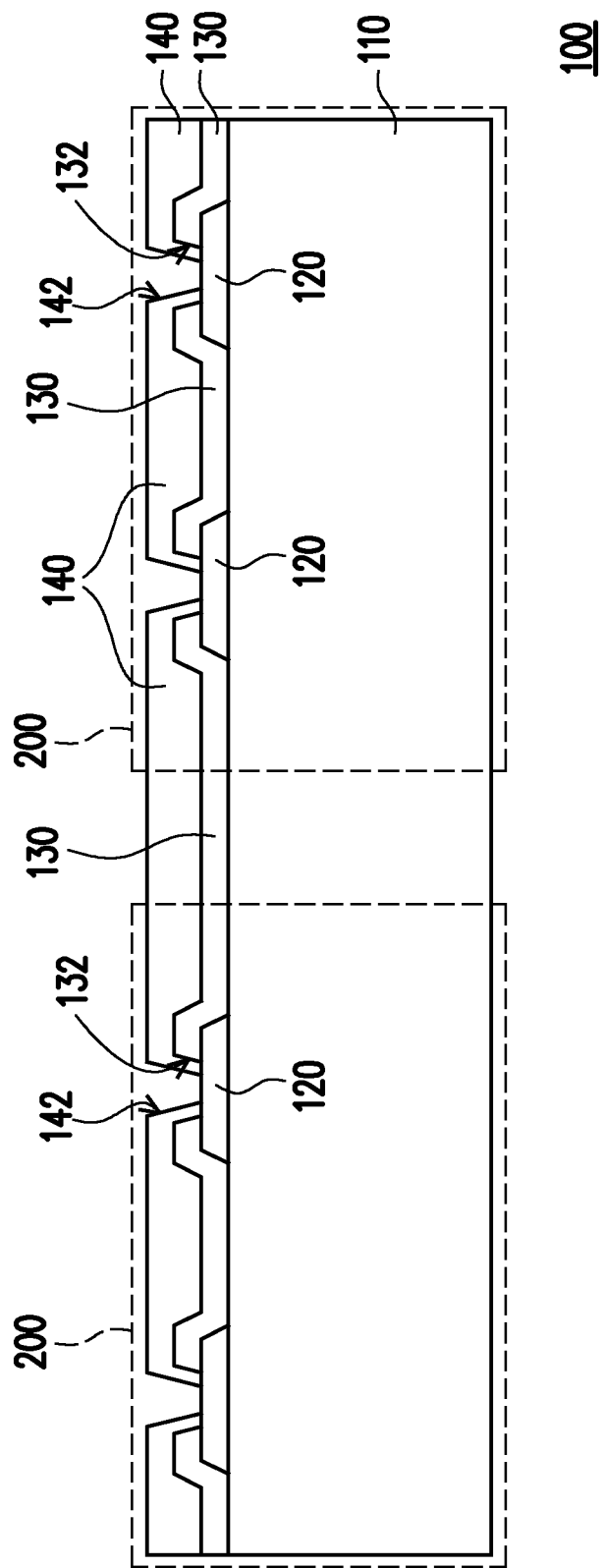
FIGS. 1 through 11 illustrate a process flow for fabricating a package-on package (PoP) structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 11 illustrate a process flow for fabricating a package-on package (PoP) structure in accordance with some embodiments of the present disclosure.

Referring to FIG. 1, a semiconductor wafer 100 including semiconductor dies 200 is provided. Before a wafer dicing process is performed on the semiconductor wafer 100, the semiconductor dies 200 of the semiconductor wafer 100 are connected one another. In some embodiments, the semiconductor wafer 100 includes a semiconductor substrate 110, conductive pads 120 formed on the semiconductor substrate 110, and a passivation layer 130. The passivation layer 130 is formed over the semiconductor substrate 110 and includes contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon dioxide layer, a silicon nitride layer, a silicon oxy-nitride layer or a dielectric layer formed by other suitable dielectric materials.

As shown in FIG. 1, in some embodiments, the semiconductor wafer 100 may optionally include a post-passivation layer 140 formed over the passivation layer 130. The post-passivation layer 140 covers the passivation layer 130 and includes contact openings 142. The conductive pads 120 exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, or a dielectric layer formed by other suitable polymers.

Figure 2:
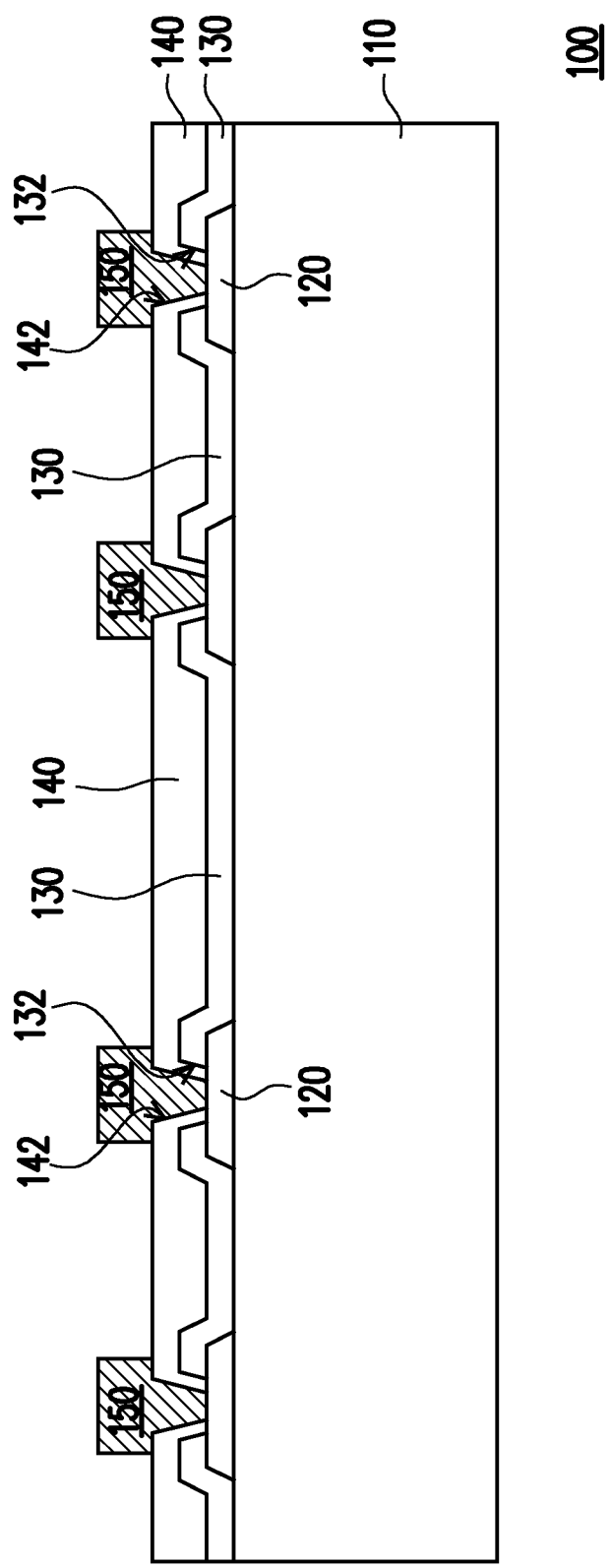

Referring to FIG. 2, conductive pillars 150 are formed on the conductive pads 120. In some embodiments, the conductive pillars 150 are plated on the conductive pads 120. The plating process for forming the conductive pillars 150 is described in detail as followings. First, a seed layer is sputtered onto the post-passivation layer 140 and the conductive pads 120 exposed by the contact openings 142. A patterned photoresist layer (not shown) is then formed over the seed layer by a photolithography process, wherein the patterned photoresist layer exposes portions of the seed layer that are corresponding to the conductive pads 120. The semiconductor wafer 100 including the patterned photoresist layer formed thereon is then immersed into a plating solution of a plating bath such that the conductive pillars 150 are plated on the portions of the seed layer that are corresponding to the conductive pads 120. After the plated conductive pillars 150 are formed, the patterned photoresist layer is stripped. Thereafter, by using the conductive pillars 150 as a mask, portions of the seed layer that are not covered by the conductive pillars 150 are removed through etching until the post passivation layer 140 is exposed, for example. In some embodiments, the conductive pillars 150 are plated copper pillars or other suitable metallic pillars.

Figure 3:
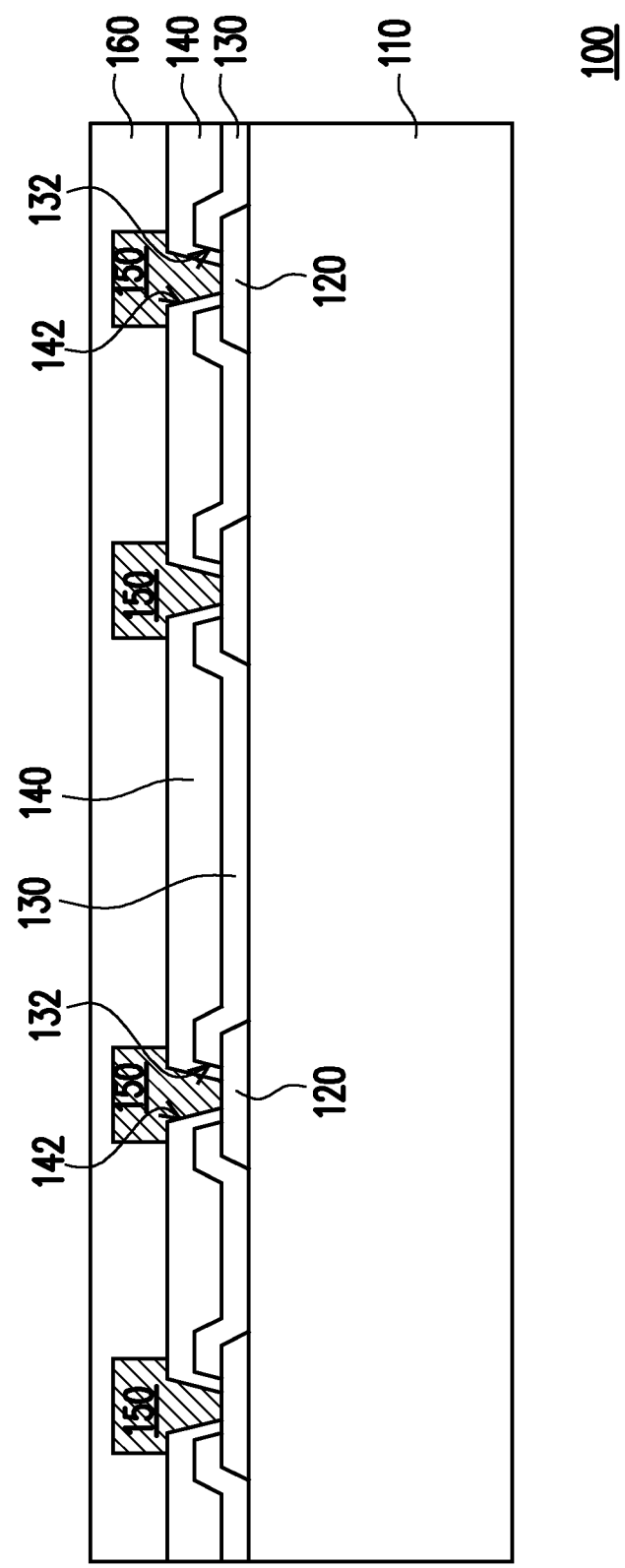

Referring to FIG. 3, after the conductive pillars 150 are formed, a protection layer 160 is formed on the post passivation layer 140 so as to cover the conductive pillars 150. In some embodiments, the protection layer 160 may be a polymer layer having sufficient thickness to encapsulate and protect the conductive pillars 150. For example, the protection layer 160 may be a polybenzoxazole (PBO) layer, a polyimide (PI) layer or other suitable polymers. In some alternative embodiments, the protection layer 160 may be made of inorganic materials.

Figure 4:
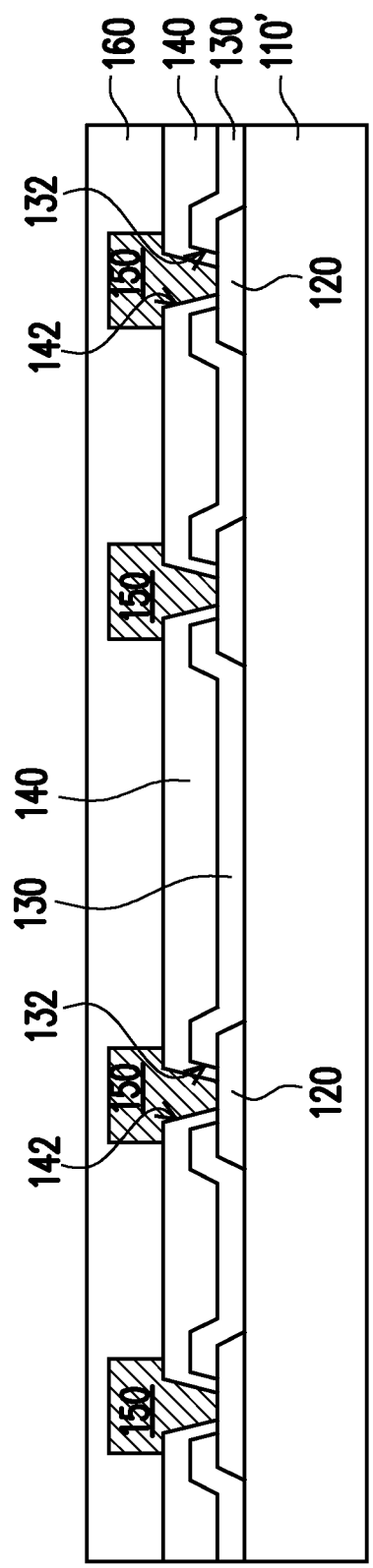

Referring to FIG. 4, a back side grinding process is performed on the back surface of the semiconductor wafer 100 after the protection layer 160 is formed. During the back side grinding process, the semiconductor substrate 110 is ground such that a thinned semiconductor wafer 100' including a thinned semiconductor substrate 110' is formed. In some embodiments, the back side grinding process includes mechanical grinding process, a chemical mechanical polishing process, or combinations thereof.

Figure 5:
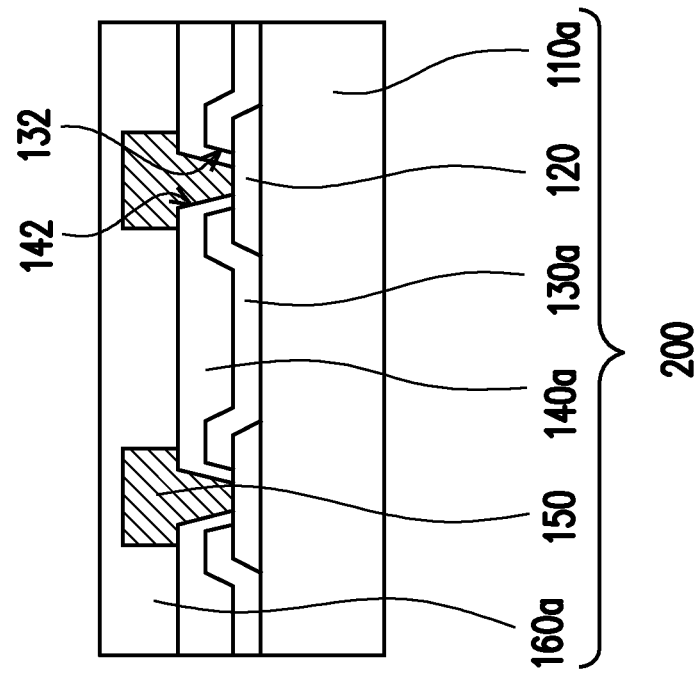
Figure 5:
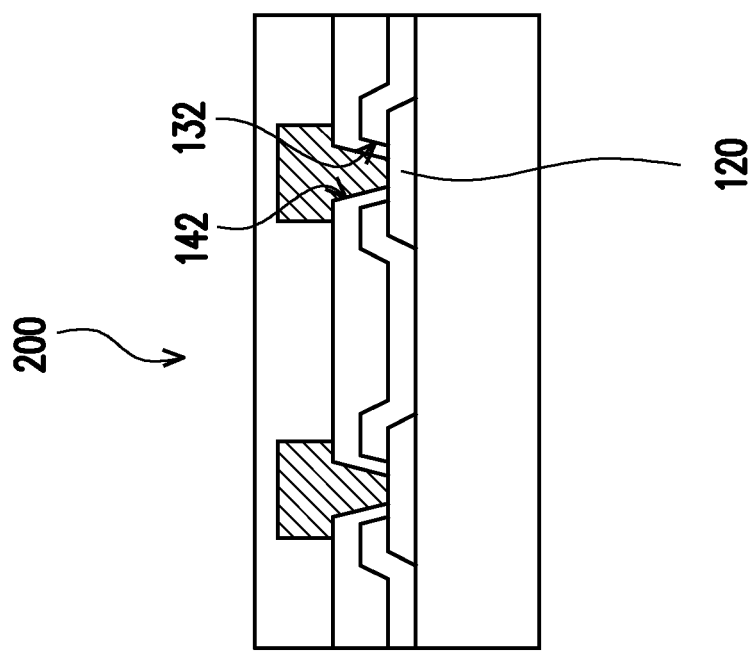

Referring to FIG. 5, after performing the back side grinding process, a wafer dicing process is performed on the thinned semiconductor wafer 100' such that the semiconductor dies 200 in the thinned semiconductor wafer 100' are singulated from one another. Each of the singulated semiconductor dies 200 may include a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the materials and the characteristics of the semiconductor substrate 110a, the passivation layer 130a, the post passivation layer 140a, and the protection layer 160a are the same as those of the semiconductor substrate 110a, the passivation layer 130, the post passivation layer 140, and the protection layer 160 mentioned above. Thus, the detailed descriptions of the semiconductor substrate 110a, the passivation layer 130a, the post passivation layer 140a, and the protection layer 160a are omitted.

As shown in FIG. 4 and FIG. 5, during the back side grinding process and the wafer dicing process, the protection layer 160 and the protection layer 160a may well protect the conductive pillars 150 of the semiconductor dies 200. In addition, the conductive pillars 150 of the semiconductor dies 200 may be protected from being damaged by sequentially performed processes, such as pick-up and placing process of the semiconductor dies 200, a molding process for laterally encapsulating the semiconductor dies 200, and so on.

Figure 6:
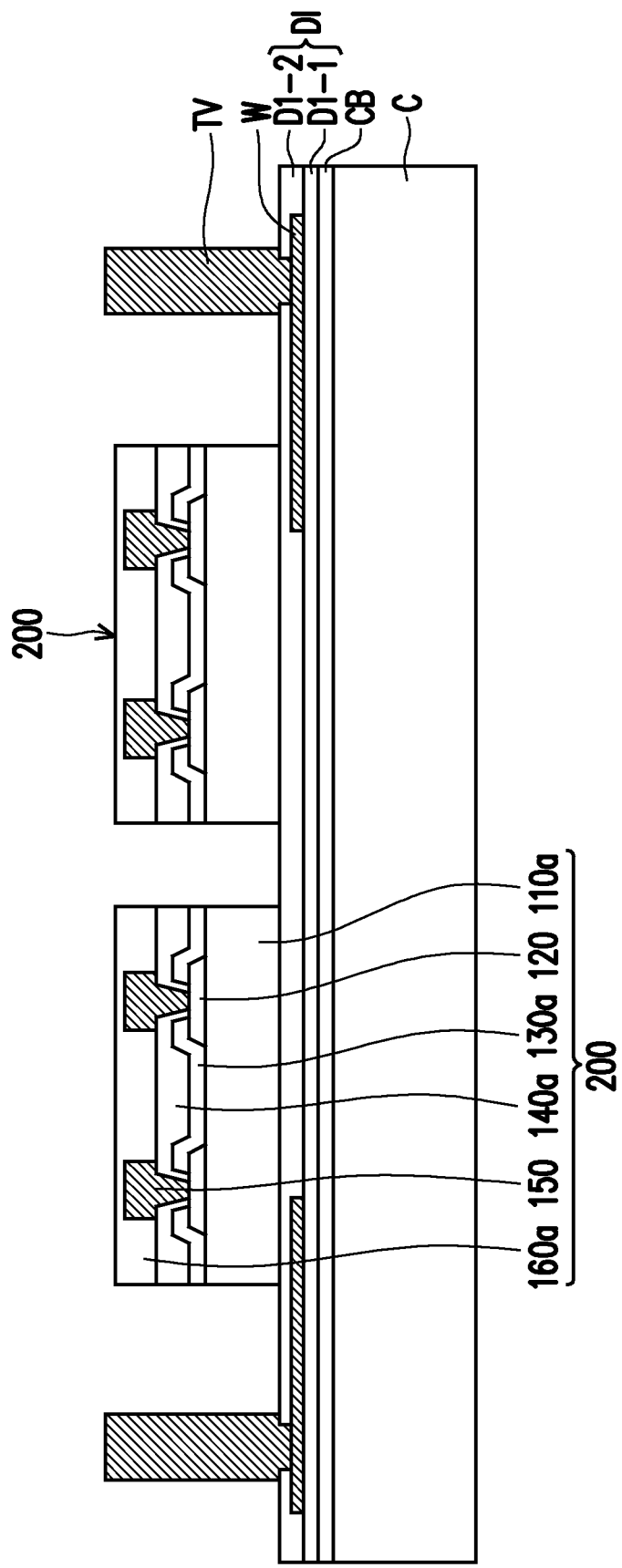

Referring to FIG. 6, after the semiconductor dies 200 are singulated from the thinned semiconductor wafer 100' (shown in FIG. 4), a carrier C including a de-bonding layer DB formed thereon is provided. In some embodiments, the carrier C is a glass substrate, a ceramic carrier, or the like. The carrier C may have a round top-view shape and a size of a common silicon wafer. For example, carrier C may have an 8-inch diameter, a 12-inch diameter, or the like. The de-bonding layer DB may be formed of a polymer-based material (e.g., a Light To Heat Conversion (LTHC) material), which may be removed along with the carrier C from the overlying structures that will be formed in subsequent steps. In some embodiments, the de-bonding layer DB is formed of an epoxy-based thermal-release material. In other embodiments, the de-bonding layer DB is formed of an ultra-violet (UV) glue. The de-bonding layer DB may be dispensed as a liquid and cured. In alternative embodiments, the de-bonding layer DB is a laminate film and is laminated onto the carrier C. The top surface of the de-bonding layer DB is substantially planar.

As illustrated in FIG. 6, a back side redistribution circuit structure including a dielectric layers DI and redistribution wirings W sandwiched between the dielectric layers DI. The dielectric layers DI includes a bottom dielectric layer DI-1 and a top dielectric layer DI-2 covering the bottom dielectric layer DI-1 and the redistribution wirings W. In some embodiments, the bottom dielectric layer DI-1 is formed of polymer, which may also be photo-sensitive material such as polybenzoxazole (PBO), polyimide, benzocyclobutene (BCB), or the like, which may be easily patterned using a photolithography process. In alternative embodiments, the bottom dielectric layer DI-1 is formed of nitride such as silicon nitride, oxide such as silicon oxide, PhosphoSilicate Glass (PSG), BoroSilicate Glass (BSG), Boron-doped PhosphoSilicate Glass (BPSG), or the like. The formation of the redistribution wirings W may include forming a seed layer (not shown) over a bottom dielectric layer DI-1, forming a patterned mask (not shown) such as a photoresist layer over the seed layer, and then performing a plating process on the exposed seed layer. The patterned mask and the portions of the seed layer covered by the patterned mask are then removed, leaving the redistribution wirings W as shown in FIG. 6. In accordance with some embodiments, the seed layer includes a titanium layer and a copper layer over the titanium layer. The seed layer may be formed using, for example, Physical Vapor Deposition (PVD). The plating may be performed using, for example, electroless plating. As shown in FIG. 6, a top dielectric layer DI-2 among the dielectric layers DI is formed over the bottom dielectric layer DI-1 to cover the redistribution wirings W. The bottom surface of the top dielectric layer DI-2 is in contact with the top surfaces of the redistribution wirings W and the bottom dielectric layer DI-1. In accordance with some embodiments of the present disclosure, the top dielectric layer DI-2 is formed of a polymer, which may be a photo-sensitive material such as PBO, polyimide, BCB, or the like. In some alternative embodiments, the top dielectric layer DI-2 is formed of nitride such as silicon nitride, oxide such as silicon oxide, PSG, BSG, BPSG, or the like. The top dielectric layer DI-2 is then patterned to form openings therein. Hence, portions of the redistribution wirings W are exposed through the openings in the top dielectric layer DI-2.

After forming the top dielectric layer DI-2 of the redistribution circuit structure over the de-bonding layer DB carried by the carrier C, metal posts TV are formed on the redistribution circuit structure and electrically connected to the redistribution wirings W of the redistribution circuit structure. Throughout the description, the metal posts TV are alternatively referred to as conductive through-vias TV since the metal posts TV penetrate through the subsequently formed molding material (shown in FIG. 8). In some embodiments, the conductive through-vias TV are formed by plating. The plating of the conductive through-vias TV may include forming a blanket seed layer (not shown) over the top dielectric layer DI-2 and extending into the openings defined in the top dielectric layer DI-2, forming and patterning a photoresist (not shown), and plating the conductive through-vias TV on the portions of the seed layer that are exposed through the openings in the photoresist. The photoresist and the portions of the seed layer that are covered by the photoresist are then removed. The material of the conductive through-vias TV may include copper, aluminum, or the like. The conductive through-vias TV may have the shape of rods. The top-view shapes of the conductive through-vias TV may be circles, rectangles, squares, hexagons, or the like.

In some embodiments, at least two singulated semiconductor dies 200 each including the conductive pads 120, the conductive pillars 150, and a protection layer 160a formed thereon are picked and placed on the dielectric layer DI. The singulated semiconductor dies 200 are picked-up and place on the top dielectric layer DI-2 and adhered with the top dielectric layer DI-2 through a die attach film (DAF), adhesion paste or the like. In some alternative embodiments, the semiconductor dies 200 are picked and placed on the top dielectric layer DI-2 in a side-by-side manner. The conductive through vias TV may be classified into groups. The number of groups of the semiconductor dies 200 is corresponding to the number of the groups of the conductive through vias TV. Each group of semiconductor dies 200 may be surrounded by a group of conductive through vias TV, respectively.

As shown in FIG. 6, the top surface of the protection layer 160a is lower than the top surfaces of the conductive through vias TV, and the top surface of the protection layer 160a is higher than the top surfaces of the conductive pillars 150, for example. However, the disclosure is not limited thereto. In some alternative embodiments, the top surface of the protection layer 160a may be substantially aligned with the top surfaces of the conductive through vias TV, and the top surface of the protection layer 160a is higher than the top surfaces of the conductive pillars 150. The semiconductor dies 200 are picked and placed on the top dielectric layer DI-2 after the formation of the conductive through vias TV. In some alternative embodiments, the semiconductor dies 200 are picked and placed on the top dielectric layer DI-2 before the formation of the conductive through vias TV.

Figure 7:
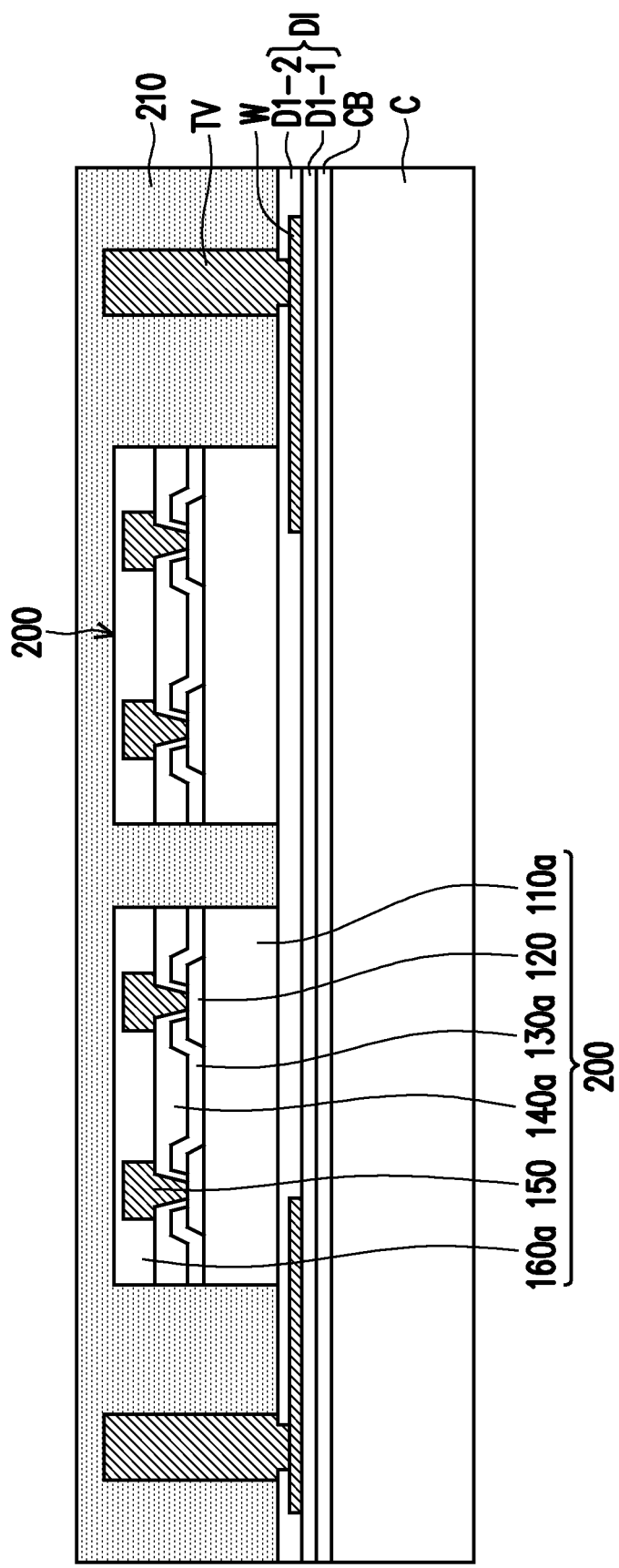

Referring to FIG. 7, an insulating material 210 is formed on the top dielectric layer DI-2 to cover the semiconductor dies 200 and the conductive through vias TV. In some embodiments, the insulating material 210 is a molding compound formed by a molding process. The insulating encapsulation material 210 may fill the gaps between neighboring conductive through-vias TV, the gaps between the semiconductor dies 200, and the gaps between the conductive through-vias TV and the semiconductor dies 200. The top surface of the insulating encapsulation material 210 is higher than the top surfaces of the semiconductor dies 200 and the top surfaces of the conductive through-vias TV. As illustrated in FIG. 7, the conductive pillars 150 and the protection layer 160a of the semiconductor die 200 are covered by the insulating material 210. In other words, the conductive pillars 150 and the protection layer 160a of the semiconductor die 200 are not revealed and are well protected by the insulating material 210. In some embodiments, the insulating material 210 includes epoxy or other suitable dielectric materials.

Figure 8:
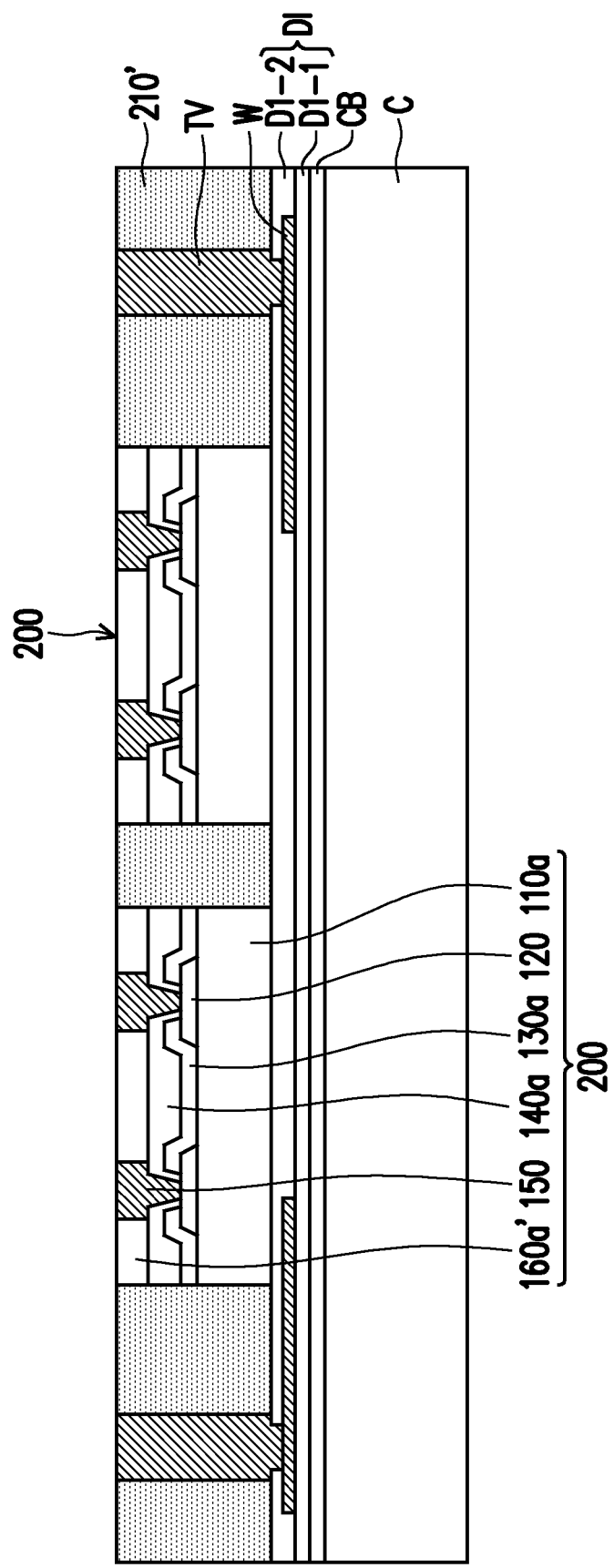

Referring to FIG. 8, the insulating material 210 is then ground until the top surfaces of the conductive pillars 150, the top surfaces of the conductive through vias TV, and the top surface of the protection layer 160a' are exposed. In some embodiments, the insulating material 210 is ground by a mechanical grinding process and/or a chemical mechanical polishing (CMP) process. After the insulating material 210 is ground, an insulating encapsulation 210' is formed over the top dielectric layer DI-2. During the grinding process of the insulating material 210, portions of the protection layer 160a are ground to form a protection layer 160a'. In some embodiments, during the grinding process of the insulating material 210 and the protection layer 160a, portions of the conductive through vias TV and portions of the conductive pillars 150 are ground also.

As shown in FIG. 8, the insulating encapsulation 210' laterally encapsulates the sidewalls of the semiconductor dies 200, and the insulating encapsulation 210' is penetrated by the conductive through vias TV. In other words, the semiconductor dies 200 and the conductive through vias TV are embedded in the insulating encapsulation 210'. It is noted that the top surfaces of the conductive through vias TV, the top surface of the insulating encapsulation 210', and the top surfaces of the conductive pillars 150 are substantially coplanar with the top surface of the protection layer 160a'.

Figure 9:
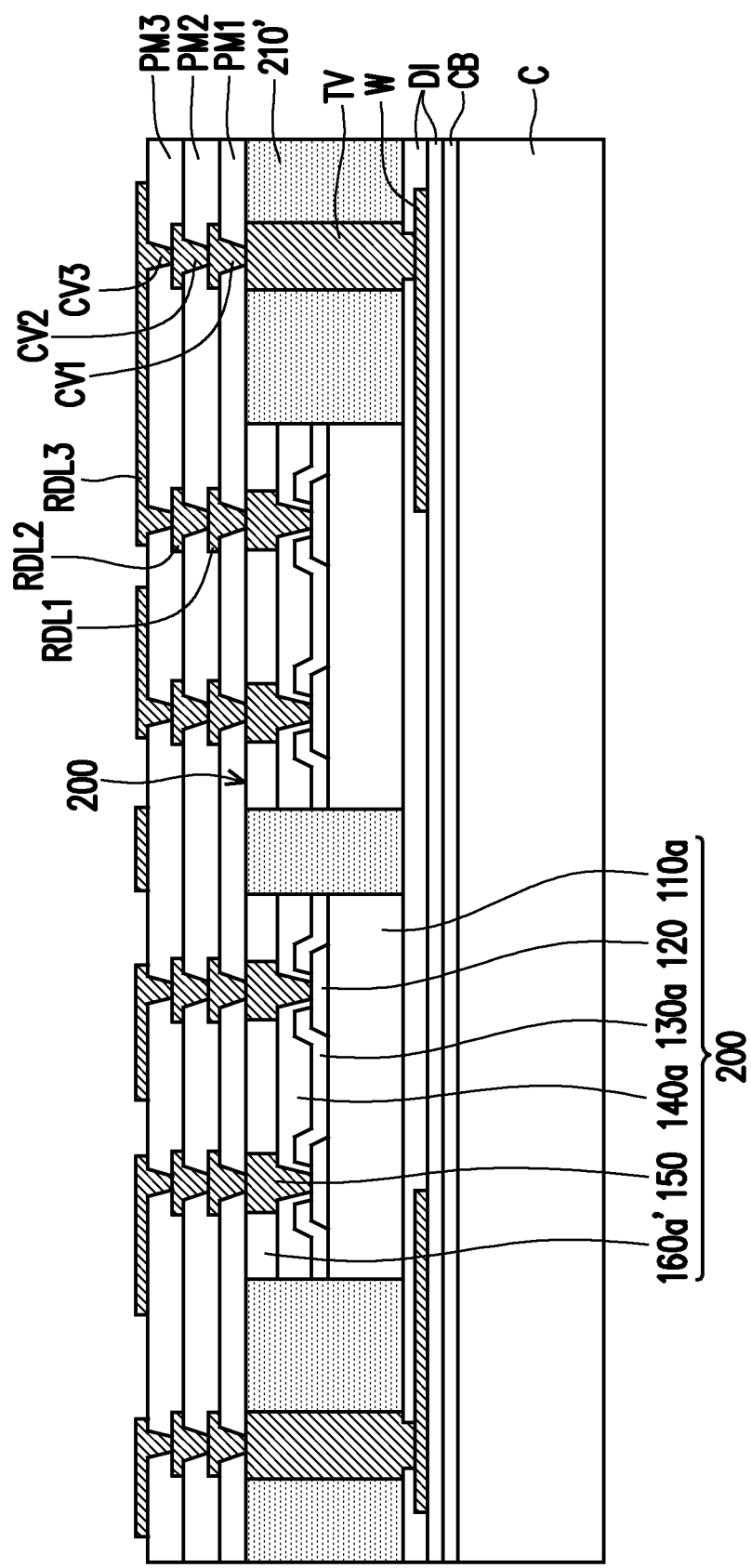

Referring to FIG. 9, after forming the insulating encapsulation 210' and the protection layer 160a', a front side redistribution circuit structure electrically connected to the conductive pillars 150 of the semiconductor dies 200 is formed on the top surfaces of the conductive through vias TV, the top surface of the insulating encapsulation 210', the top surfaces of the conductive pillars 150, and the top surface of the protection layer 160a'. The front side redistribution circuit structure is fabricated to electrically connect with one or more connectors underneath. Here, the aforesaid connectors may be the conductive pillars 150 of the semiconductor dies 200 and/or the conductive through vias TV embedded in the insulating encapsulation 210'. The front side redistribution circuit structure is described in accompany with FIG. 9 in detail.

The front side redistribution circuit structure may include a dielectric layer PM1, a dielectric layer PM2, a dielectric layer PM3, conductive vias CV1, conductive vias CV2, conductive vias CV3, redistribution wirings RDL1, redistribution wirings RDL2, and redistribution wirings RDL3. The conductive vias CV1 are embedded in the dielectric layer PM1, the conductive vias CV2 are embedded in the dielectric layer PM2, and the conductive vias CV3 are embedded in the dielectric layer PM3. In other words, the conductive vias CV1 penetrate through the dielectric layer PM1, the conductive vias CV2 penetrate through the dielectric layer PM2, and the conductive vias CV3 penetrate through the dielectric layer PM3. The redistribution wirings RDL1 are disposed on the top surface of the dielectric layer PM1 and located between the dielectric layer PM1 and the dielectric layer PM2. The redistribution wirings RDL2 are disposed on the top surface of the dielectric layer PM2 and located between the dielectric layer PM2 and the dielectric layer PM3. The redistribution wirings RDL3 are disposed on the top surface of the dielectric layer PM3. Portions of the redistribution wirings RDL1 are electrically connected to the conductive pillars 150 through the conductive vias CV1. Portions of the redistribution wirings RDL2 are electrically connected to the redistribution wirings RDL1 through the conductive vias CV2. Portions of the redistribution wirings RDL3 are electrically connected to the redistribution wirings RDL2 through the conductive vias CV3. In some embodiments, the dielectric layers PM1, PM2, and PM3 are formed of a polymer, which may be a photo-sensitive material such as PBO, polyimide, BCB, or the like. In an embodiment where the material of the dielectric layers PM1, PM2, and PM3 is a photo-sensitive material, the dielectric layers PM1, PM2, and PM3 are formed by a deposition process such as a chemical vapor deposition (CVD) process, and the dielectric layers PM1, PM2, and PM3 are patterned by a photolithography process such that via holes are formed in the dielectric layers PM1, PM2, and PM3. In some alternative embodiments, the dielectric layers PM1, PM2, and PM3 are formed of nitride such as silicon nitride, oxide such as silicon oxide, PSG, BSG, BPSG, or the like. In an embodiment where the material of the dielectric layers PM1, PM2, and PM3 is nitride or oxide, the dielectric layers PM1, PM2, and PM3 are formed by a deposition process such as a CVD process, and the dielectric layers PM1, PM2, and PM3 are patterned through an etch process by using a patterned photoresist layer as an etch mask such that via holes are formed in the dielectric layers PM1, PM2, and PM3. The material of the dielectric layers PM1, PM2, and PM3 may be identical to or different from each other. In some embodiments, the material of the redistribution wirings RDL1, RDL2, and RDL3 may include copper, aluminum, alloy thereof, or the like. In some embodiments, the material of the conductive vias CV1, CV2, and CV3 may include copper, aluminum, alloy thereof, or the like.

A first dielectric material is deposited on the top surfaces of the conductive through vias TV, the top surface of the insulating encapsulation 210', the top surfaces of the conductive pillars 150, and the top surface of the protection layer 160a'. The deposited first dielectric material is patterned to form the dielectric layer PM1 having via holes therein. The via holes defined in the dielectric layer PM1 may locate above and expose the top surfaces of the conductive pillars 150 and the top surfaces of the conductive through vias TV. Then, the conductive vias CV1 and redistribution wirings RDL1 are formed over the dielectric layer PM1 through a deposition process followed by a patterning process such that the conductive vias CV1 fills the via holes defined in the dielectric layer PM1 and the redistribution wirings RDL1 covers the conductive vias CV1 and a top surface of the dielectric layer PM1. It is noted that portions of the redistribution wirings RDL1 may serve as bottom tiered bridging wirings electrically connected between the adjacent semiconductor dies 200.

A second dielectric material is deposited on a top surface of the dielectric layer PM1 to cover the redistribution wirings RDL1. The deposited second dielectric material is patterned to form the dielectric layer PM2 having via holes therein. The via holes defined in the dielectric layer PM2 may locate above and expose the top surfaces of the redistribution wirings RDL1. Then, the conductive vias CV2 and redistribution wirings RDL2 are formed over the dielectric layer PM2 through a deposition process followed by a patterning process such that the conductive vias CV2 fills the via holes defined in the dielectric layer PM2 and the redistribution wirings RDL2 covers the conductive vias CV2 and the top surface of the dielectric layer PM2. It is noted that portions of the redistribution wirings RDL2 may serve as middle tiered bridging wirings electrically connected between the adjacent semiconductor dies 200.

A third dielectric material is deposited on a top surface of the dielectric layer PM2 to cover the redistribution wirings RDL2. The deposited third dielectric material is patterned to form the dielectric layer PM3 having via holes therein. The via holes defined in the dielectric layer PM3 may locate above and expose the top surfaces of the redistribution wirings RDL2. Then, the conductive vias CV3 and redistribution wirings RDL3 are formed over the dielectric layer PM3 through a deposition process followed by a patterning process such that the conductive vias CV3 fills the via holes defined in the dielectric layer PM3 and the redistribution wirings RDL3 covers the conductive vias CV3 and the top surface of the dielectric layer PM3. It is noted that portions of the redistribution wirings RDL3 may serve as top tiered bridging wirings electrically connected between the adjacent semiconductor dies 200. In some embodiments, two tiers of redistribution wirings among the redistribution wirings RDL1, RDL2 and RDL3 serve as bridging wirings electrically connected between the adjacent semiconductor dies 200. In some alternative embodiments, three tiers of redistribution wirings RDL1, RDL2 and RDL3 serve as bridging wirings electrically connected between the adjacent semiconductor dies 200. Furthermore, more than three layers of redistribution wirings may be formed in the front side redistribution circuit structure, and the bridging wirings for electrically connecting the adjacent semiconductor dies 200 may be formed in at least two layers of redistribution wirings.

Figure 10:
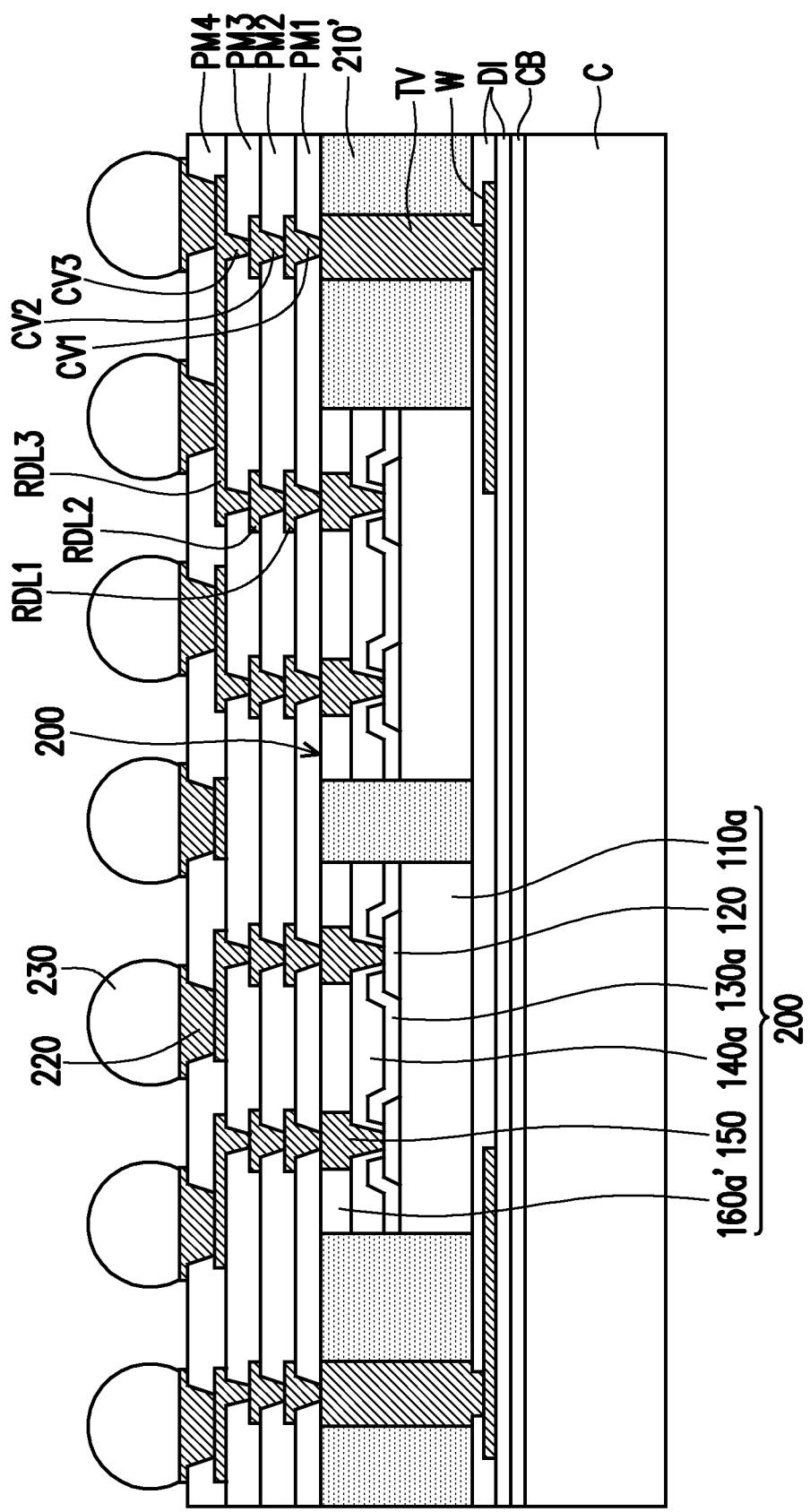

Referring to FIG. 10, after forming the front side redistribution circuit structure, a dielectric layer PM4, conductive pads 220, and conductive terminals 230 are formed over the front side redistribution circuit structure. The dielectric layer PM4 is formed on the dielectric layer PM3 to cover redistribution wirings RDL3. The conductive pads 220 are formed on the dielectric layer PM4 and are electrically connected to the redistribution wirings RDL3. The conductive terminals 230 lands on the conductive pads 220 and electrically connected to the front side redistribution circuit structure through the pads 220. In some embodiments, the conductive pads 220 include under-ball metallurgy (UBM) patterns for ball mount and/or connection pads for mounting of passive components. The dielectric layer PM4 may be formed of nitride such as silicon nitride, oxide such as silicon oxide, PSG, BSG, BPSG, or the like. The material of the dielectric layer PM4 may be identical to or different from the dielectric layers PM1, PM2, and PM3. In some embodiments, the material of the conductive pads 220 may include copper, aluminum, alloy thereof, or the like. In some embodiments, the conductive terminals 230 may include solder balls, metal pillars, metal pillars covered by solder caps, or the like. Throughout the description, the combined structure including the semiconductors dies 200, the conductive through-vias TV, the insulating encapsulant 210', the front side redistribution circuit structures and the back side redistribution circuit structures will be referred to as a package, which may be a composite wafer with a round top-view shape.

Figure 11:
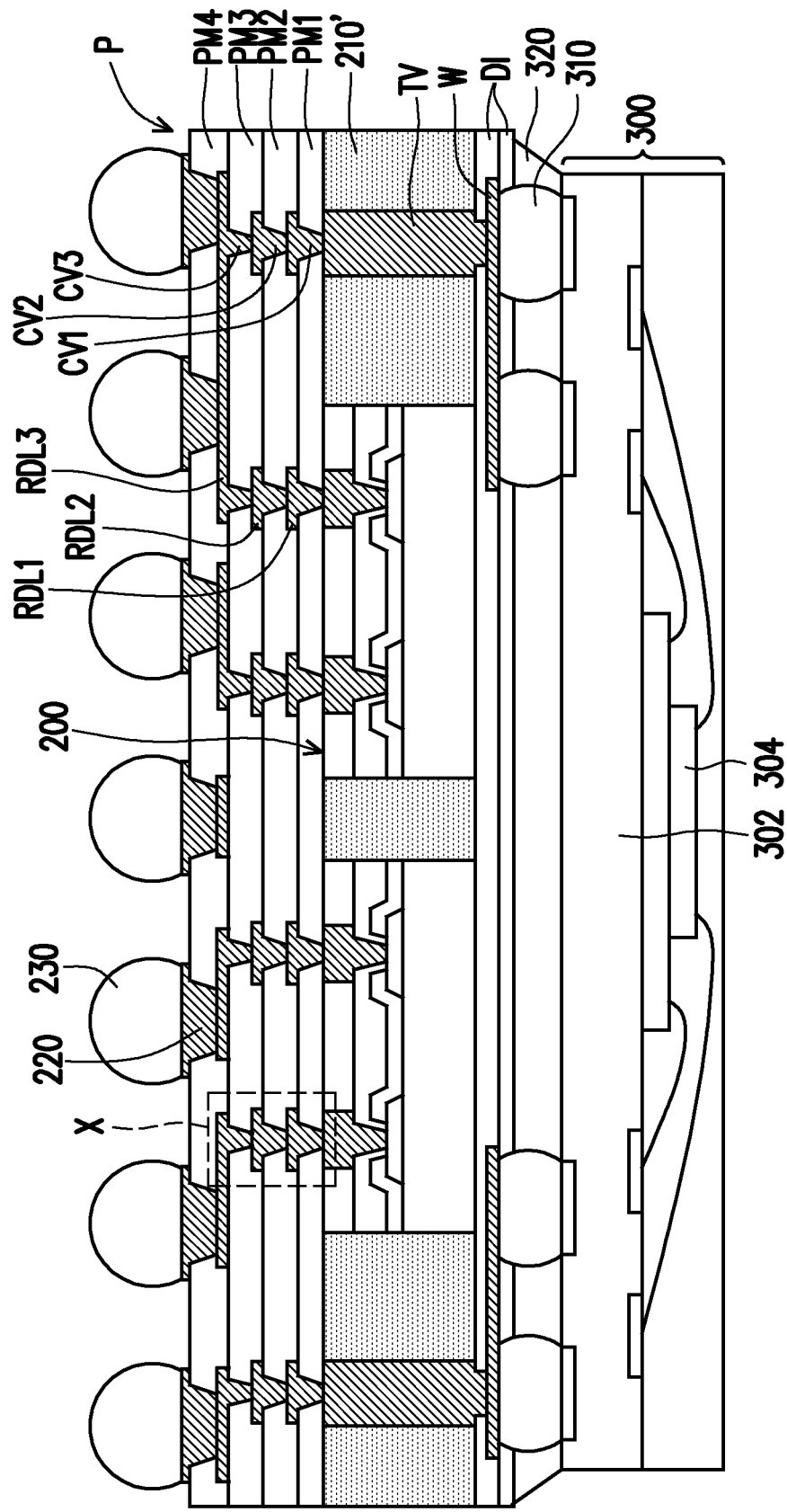

Referring to FIG. 11, the package is de-bonded from carrier C. The de-bonding layer DB is also cleaned from the package. The de-bonding process may be performed by irradiating a light such as UV light or laser on the de-bonding layer DB to decompose the de-bonding layer DB. In the de-bonding process, a tape (not shown) may be adhered onto the dielectric layer PM4 and the conductive terminals 230. In subsequent steps, the carrier C and the de-bonding layer DB are removed from the package. A die saw process is performed to saw the package into multiple Integrated Fanout (InFO) package structures P, each including at least two semiconductor dies 200, conductive through-vias TV, an insulating encapsulant 210', a front side redistribution circuit structure, and a back side redistribution circuit structure. One of the resulting packages is shown as a package structure P illustrated in FIG. 11.

FIG. 11 illustrates a PoP structure in accordance with some embodiments of the present disclosure. Referring to FIG. 11, another package structure 300 is provided and bonded with the package structure P such that a PoP structure is formed. In some embodiments of the present disclosure, the bonding between the package structure 300 and the package structure P is performed through solder regions 310, which joins the redistribution wirings W to the metal pads in the package structure 300. In some embodiments, the package 300 includes device dies 302, which may be memory dies such as Static Random Access Memory (SRAM) dies, Dynamic Random Access Memory (DRAM) dies, or the like. The memory dies may also be bonded to package substrate 304 in some exemplary embodiments.

As illustrated in FIG. 11, the PoP structure includes a package structure 300 and a package structure P electrically connected to the package structure 300 through solder regions 310. The package structure P includes at least two semiconductor dies 200, conductive through-vias TV, an insulating encapsulation 210' laterally encapsulating the semiconductor dies 200 and the conductive through-vias TV, a back side redistribution circuit structure, a front side redistribution circuit structure, a dielectric layer PM4, conductive pads 220, and conductive terminals 230. The back side redistribution circuit structure includes dielectric layers DI and redistribution wirings W. The front side redistribution circuit structure includes dielectric layers PM1 through PM3, conductive vias CV1 through CV3, and redistribution wirings RDL1 through RDL3.

FIG. 12A, FIG. 12B, FIG. 13, FIG. 14A, FIG. 14B, FIG. 15A and FIG. 15B are enlarged views of the region X illustrated in FIG. 11 in accordance with various embodiments of the present disclosure. In order to establish multilayered bridging wirings, various types of stacked via structures capable of minimizing via crack issue resulted from concentrated stress are proposed.

Figure 12A:
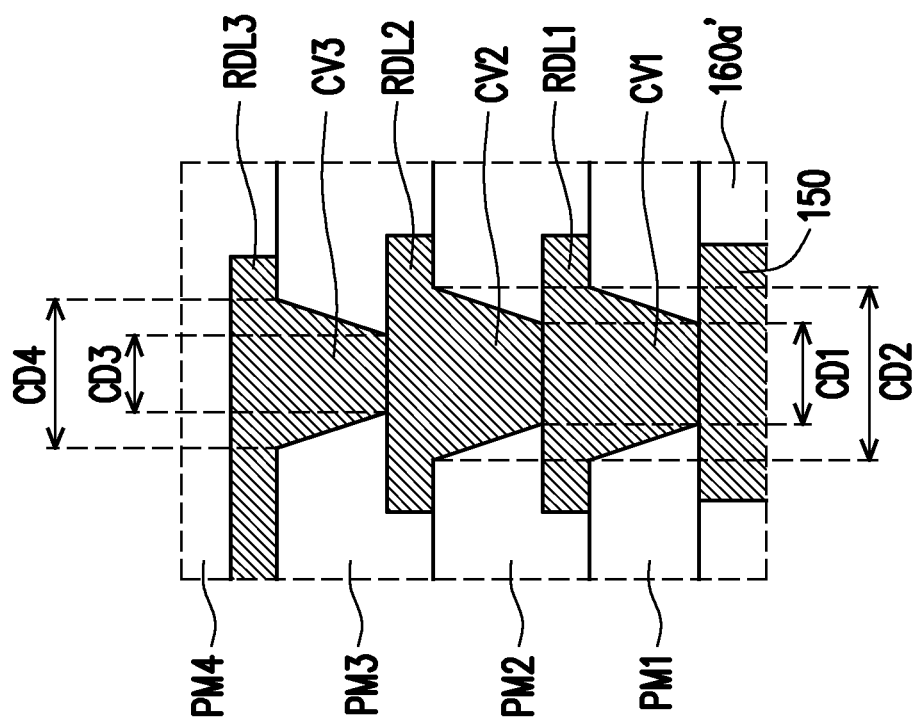
FIG. 12A, FIG. 12B, FIG. 13, FIG. 14A, FIG. 14B, FIG. 15A and FIG. 15B are enlarged views of the region X illustrated in FIG. 11 in accordance with various embodiments of the present disclosure.
Figure 12B:
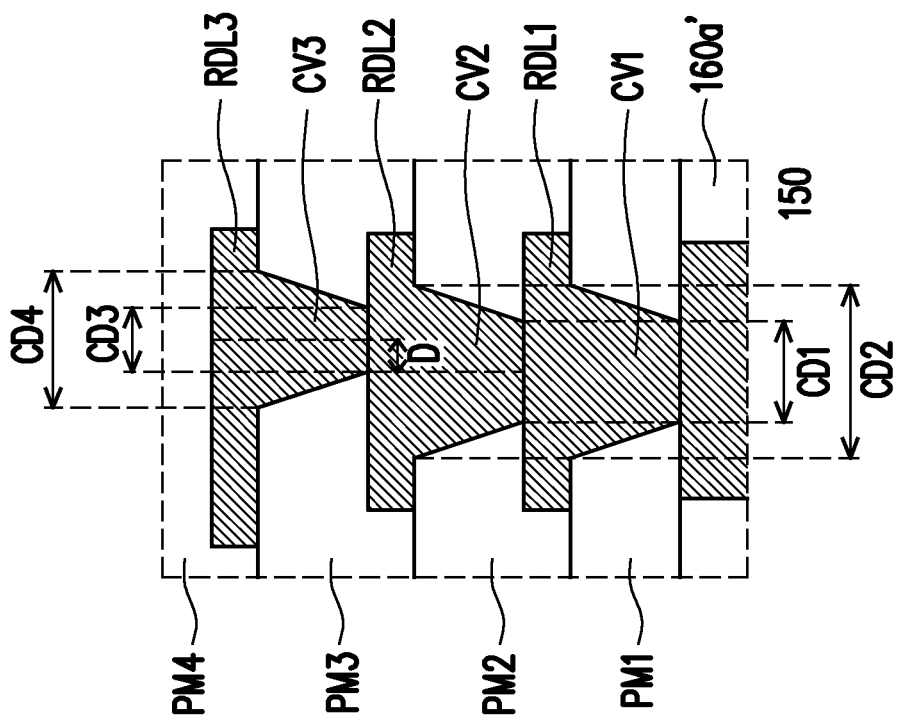

Referring to FIG. 12A and FIG. 12B, a stacked via structure including a dielectric layer PM1, a conductive via CV1, a redistribution wirings RDL1, a dielectric layer PM2, a conductive via CV2, a redistribution wirings RDL2, a dielectric layer PM3, a conductive via CV3, a redistribution wirings RDL3, and a dielectric layer PM4 is proposed. The dielectric layer PM1 covers the conductive pillar 150 and the protection layer 160a'. The conductive via CV1 is embedded in a via hole defined by the dielectric layer PM1 and electrically connected to the conductive pillar 150. The redistribution wirings RDL1 is electrically connected to the conductive pillars 150 through the conductive via CV1, and the redistribution wirings RDL1 includes a pad portion covering the dielectric layer PM1 and the conductive via CV1. The conductive via CV1 is entirely covered by the pad portion of the redistribution wirings RDL1. The dielectric layer PM2 covers the dielectric layer PM1 and the redistribution wirings RDL1. The conductive via CV2 is embedded in a via hole defined by the dielectric layer PM2 and electrically connected to the redistribution wirings RDL1. The redistribution wirings RDL2 is electrically connected to the redistribution wirings RDL1 through the conductive via CV2, and the redistribution wirings RDL2 includes a pad portion covering the dielectric layer PM2 and the conductive via CV2. The conductive via CV2 is entirely covered by the pad portion of the redistribution wirings RDL2. The dielectric layer PM3 covers the dielectric layer PM2 and the redistribution wirings RDL2. The conductive via CV3 is embedded in a via hole defined by the dielectric layer PM3 and electrically connected to the redistribution wirings RDL2. The redistribution wirings RDL3 is electrically connected to the redistribution wirings RDL2 through the conductive via CV3, and the redistribution wirings RDL3 includes a pad portion covering the dielectric layer PM3 and the conductive via CV3. The conductive via CV3 is entirely covered by the pad portion of the redistribution wirings RDL3. The dielectric layer PM4 covers the dielectric layer PM3 and the redistribution wirings RDL3.

As illustrated in FIG. 12A and FIG. 12B, the conductive vias CV1, CV2, and CV3 respectively includes tapered sidewalls. The bottom width CD1 of the conductive vias CV1 and CV2 is less than the top width CD2 of the conductive vias CV1 and CV2. The bottom width CD3 of the conductive via CV3 is less than the top width CD4 of the conductive via CV3. The bottom width CD3 of the conductive via CV3 is less than the bottom width CD1 of the conductive vias CV1 and CV2. The top width CD4 of the conductive via CV3 is greater than the bottom width CD1 of the conductive vias CV1 and CV2, and the top width CD4 of the conductive via CV3 is less than the top width CD2 of the conductive vias CV1 and CV2. The bottom width CD1 of the conductive vias CV1 and CV2 may range from about 5 micrometers to about 10 micrometers, and a ratio of the bottom width CD3 of the conductive via CV3 and the bottom width CD1 of the conductive vias CV1 and CV2 may range from about 0.7 to about 0.9. The lateral dimension (e.g., diameter or width) of the pad portion of the redistribution wirings RDL1 may be greater than the top width CD2 of the conductive via CV1. The lateral dimension (e.g., diameter or width) of the pad portion of the redistribution wirings RDL2 may be greater than the top width CD2 of the conductive via CV2. The lateral dimension (e.g., diameter or width) of the pad portion of the redistribution wirings RDL3 may be greater than the top width CD4 of the conductive via CV3. Since the bottom width CD3 of the conductive via CV3 is less than the bottom width CD1 of the conductive vias CV1 and CV2, the stacked via structure including the conductive vias CV1, CV2, and CV3 is capable of minimize via crack issue resulted from concentrated stress. As illustrated in FIG. 12A, the conductive vias CV1, CV2, and CV3 are stacked along a stacking direction, and the centerlines of the conductive vias CV1, CV2, and CV3 are aligned in the stacking direction. As illustrated in FIG. 12B, the conductive vias CV1, CV2, and CV3 are stacked along a stacking direction, and the centerlines of the conductive vias CV1 and CV2 are not aligned with the centerline of the conductive via CV3 in the stacking direction. In other words, the centerlines of the conductive vias CV1 and CV2 may offset from the centerline of the conductive via CV3 by a lateral distance D. In some embodiments, the lateral distance D is greater than 0 and less than 10 micrometers.

As illustrated in FIG. 12A and FIG. 12B, the contact area of the conductive pillar 150 and the conductive via CV1 is substantially equal to the contact area of the redistribution wirings RDL1 and the conductive via CV2. Further, the contact area of the conductive pillar 150 and the conductive via CV1 is greater than the contact area of the redistribution wirings RDL2 and the conductive via CV3.

Figure 13:
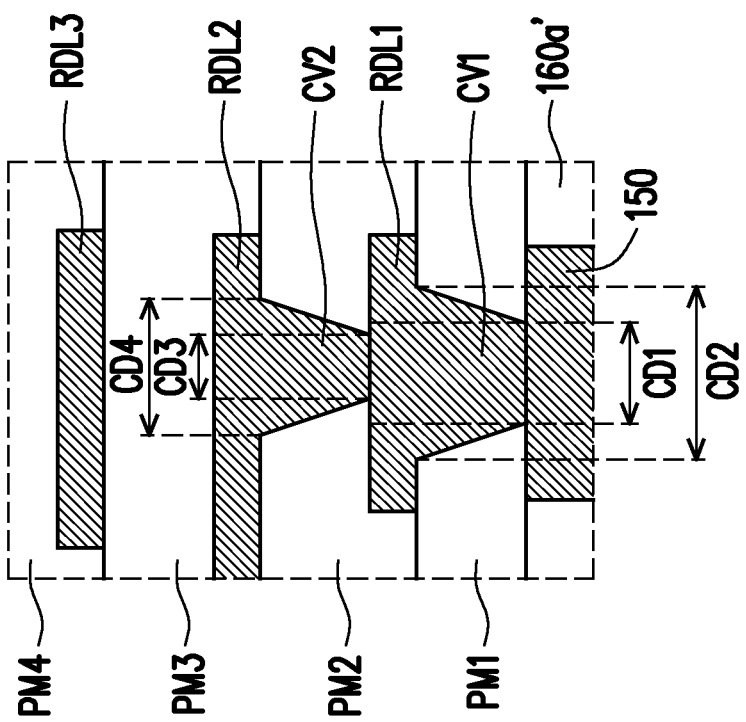

Referring to FIG. 13, a stacked via structure including a dielectric layer PM1, a conductive via CV1, a redistribution wirings RDL1, a dielectric layer PM2, a conductive via CV2, a redistribution wirings RDL2, a dielectric layer PM3, a redistribution wirings RDL3, and a dielectric layer PM4 is proposed. The dielectric layer PM1 covers the conductive pillar 150 and the protection layer 160a'. The conductive via CV1 is embedded in a via hole defined by the dielectric layer PM1 and electrically connected to the conductive pillar 150. The redistribution wirings RDL1 is electrically connected to the conductive pillars 150 through the conductive via CV1, and the redistribution wirings RDL1 includes a pad portion covering the dielectric layer PM1 and the conductive via CV1. The conductive via CV1 is entirely covered by the pad portion of the redistribution wirings RDL1. The dielectric layer PM2 covers the dielectric layer PM1 and the redistribution wirings RDL1. The conductive via CV2 is embedded in a via hole defined by the dielectric layer PM2 and electrically connected to the redistribution wirings RDL1. The redistribution wirings RDL2 is electrically connected to the redistribution wirings RDL1 through the conductive via CV2, and the redistribution wirings RDL2 includes a pad portion covering the dielectric layer PM2 and the conductive via CV2. The conductive via CV2 is entirely covered by the pad portion of the redistribution wirings RDL2. The dielectric layer PM3 covers the dielectric layer PM2 and the redistribution wirings RDL2. The redistribution wirings RDL3 is located above and spaced apart from the redistribution wirings RDL2 by the dielectric layer PM3. The dielectric layer PM4 covers the dielectric layer PM3 and the redistribution wirings RDL3.

As illustrated in FIG. 13, the conductive vias CV1 and CV2 respectively includes tapered sidewalls. The bottom width CD1 of the conductive via CV1 is less than the top width CD1 of the conductive via CV1. The bottom width CD3 of the conductive via CV2 is less than the top width CD4 of the conductive via CV2. The bottom width CD3 of the conductive via CV2 is less than the bottom width CD1 of the conductive via CV1. The top width CD4 of the conductive via CV2 is greater than the bottom width CD1 of the conductive via CV, and the top width CD4 of the conductive via CV2 is less than the top width CD2 of the conductive via CV1. The bottom width CD1 of the conductive via CV1 may range from about 5 micrometers to about 10 micrometers, and a ratio of the bottom width CD3 of the conductive via CV2 and the bottom width CD1 of the conductive via CV1 may range from about 0.7 to about 0.9. The lateral dimension (e.g., diameter or width) of the pad portion of the redistribution wirings RDL1 may be greater than the top width CD2 of the conductive via CV1. The lateral dimension (e.g., diameter or width) of the pad portion of the redistribution wirings RDL2 may be greater than the top width CD4 of the conductive via CV2. Since the bottom width CD3 of the conductive via CV2 is less than the bottom width CD1 of the conductive via CV1, the stacked via structure including the conductive vias CV1 and CV2 is capable of minimize via crack issue resulted from concentrated stress. As illustrated in FIG. 13, the conductive vias CV1 and CV2 are stacked along a stacking direction, and the centerlines of the conductive via CV1 and CV2 are aligned in the stacking direction. In some alternative embodiments, not illustrated in figures, the conductive vias are stacked along a stacking direction, and the centerlines of the conductive vias is not aligned with the centerline of the conductive via in the stacking direction.

As illustrated in FIG. 13, the contact area of the conductive pillar 150 and the conductive via CV1 is greater than the contact area of the redistribution wirings RDL1 and the conductive via CV2.

Figure 14A:
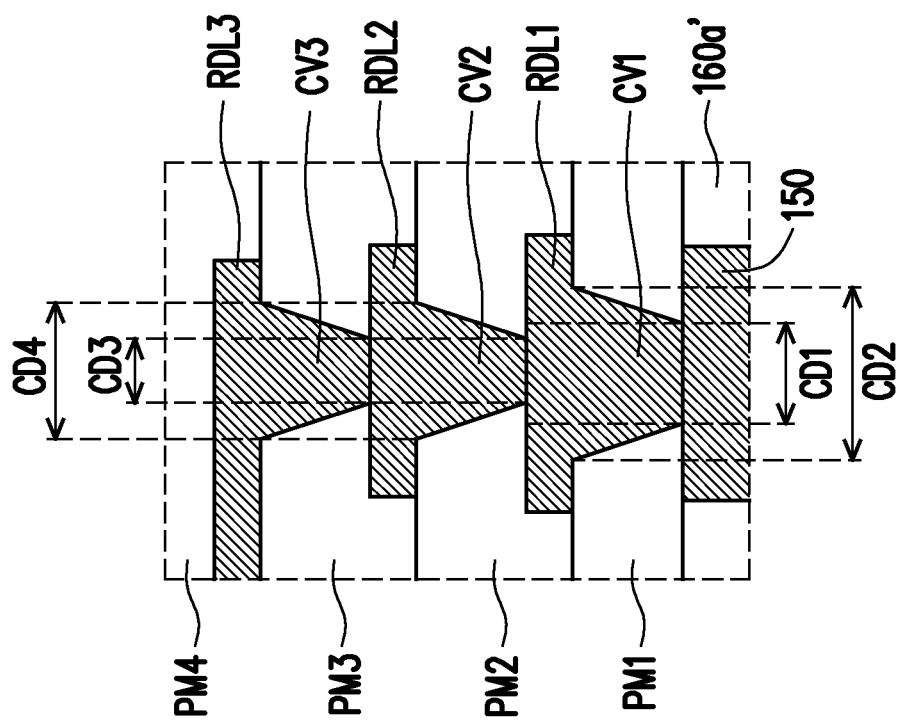
Figure 14B:
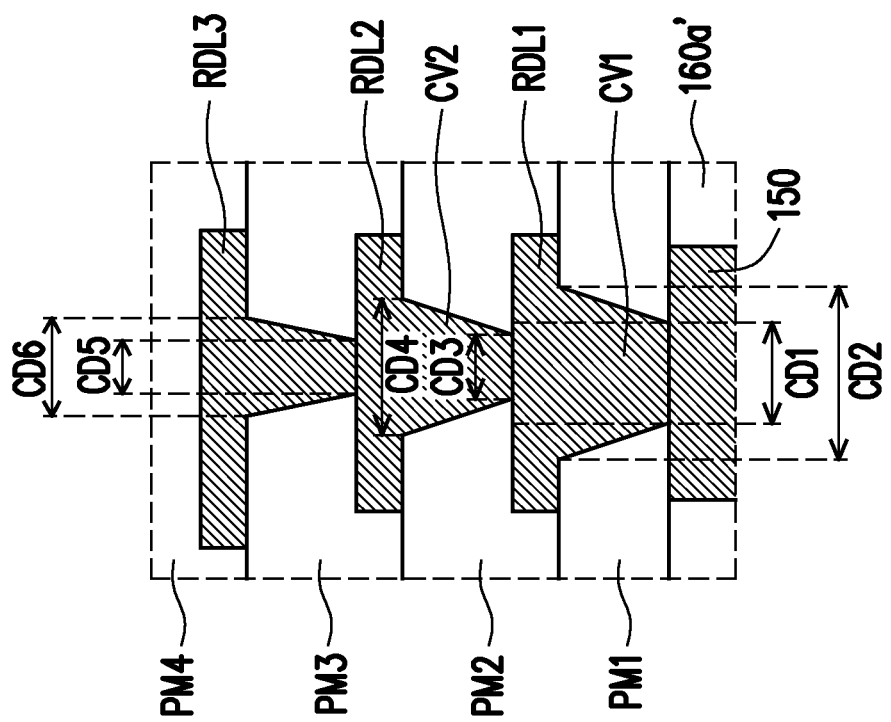

Referring to FIG. 14A and FIG. 14B, a stacked via structure including a dielectric layer PM1, a conductive via CV1, a redistribution wirings RDL1, a dielectric layer PM2, a conductive via CV2, a redistribution wirings RDL2, a dielectric layer PM3, a conductive via CV3, a redistribution wirings RDL3, and a dielectric layer PM4 is proposed. The dielectric layer PM1 covers the conductive pillar 150 and the protection layer 160a'. The conductive via CV1 is embedded in a via hole defined by the dielectric layer PM1 and electrically connected to the conductive pillar 150. The redistribution wirings RDL1 is electrically connected to the conductive pillars 150 through the conductive via CV1, and the redistribution wirings RDL1 includes a pad portion covering the dielectric layer PM1 and the conductive via CV1. The conductive via CV1 is entirely covered by the pad portion of the redistribution wirings RDL1. The dielectric layer PM2 covers the dielectric layer PM1 and the redistribution wirings RDL1. The conductive via CV2 is embedded in a via hole defined by the dielectric layer PM2 and electrically connected to the redistribution wirings RDL1. The redistribution wirings RDL2 is electrically connected to the redistribution wirings RDL1 through the conductive via CV2, and the redistribution wirings RDL2 includes a pad portion covering the dielectric layer PM2 and the conductive via CV2. The conductive via CV2 is entirely covered by the pad portion of the redistribution wirings RDL2. The dielectric layer PM3 covers the dielectric layer PM2 and the redistribution wirings RDL2. The conductive via CV3 is embedded in a via hole defined by the dielectric layer PM3 and electrically connected to the redistribution wirings RDL2. The redistribution wirings RDL3 is electrically connected to the redistribution wirings RDL2 through the conductive via CV3, and the redistribution wirings RDL3 includes a pad portion covering the dielectric layer PM3 and the conductive via CV3. The conductive via CV3 is entirely covered by the pad portion of the redistribution wirings RDL3. The dielectric layer PM4 covers the dielectric layer PM3 and the redistribution wirings RDL3.

As illustrated in FIG. 14A, the conductive vias CV1, CV2, and CV3 respectively includes tapered sidewalls. The bottom width CD1 of the conductive via CV1 is less than the top width CD2 of the conductive via CV1. The bottom width CD3 of the conductive vias CV2 and CV3 is less than the top width CD4 of the conductive vias CV2 and CV3. The bottom width CD3 of the conductive vias CV2 and CV3 is less than the bottom width CD1 of the conductive via CV1. The top width CD4 of the conductive vias CV2 and CV3 is greater than the bottom width CD1 of the conductive via CV1, and the top width CD4 of the conductive vias CV2 and CV3 is less than the top width CD2 of the conductive via CV1. The bottom width CD1 of the conductive via CV1 may range from about 5 micrometers to about 10 micrometers, and a ratio of the bottom width CD3 of the conductive vias CV2 and CV3 and the bottom width CD1 of the conductive via CV1 may range from about 0.7 to about 0.9. The lateral dimension (e.g., diameter or width) of the pad portion of the redistribution wirings RDL1 may be greater than the top width CD2 of the conductive via CV1. The lateral dimension (e.g., diameter or width) of the pad portion of the redistribution wirings RDL2 may be greater than the top width CD2 of the conductive via CV2. The lateral dimension (e.g., diameter or width) of the pad portion of the redistribution wirings RDL3 may be greater than the top width CD4 of the conductive via CV3. Since the bottom width CD3 of the conductive vias CV2 and CV3 is less than the bottom width CD1 of the conductive via CV1, the stacked via structure including the conductive vias CV1, CV2, and CV3 is capable of minimize via crack issue resulted from concentrated stress. As illustrated in FIG. 14A, the conductive vias CV1, CV2, and CV3 are stacked along a stacking direction, and the centerlines of the conductive vias CV1, CV2, and CV3 are aligned in the stacking direction. In some alternative embodiments, not illustrated in figures, the conductive vias are stacked along a stacking direction, and the centerline of at least one conductive vias is not aligned with the centerlines of the rest conductive vias.

As illustrated in FIG. 14A, the contact area of the redistribution wirings RDL1 and the conductive via CV2 is substantially equal to the contact area of the redistribution wirings RDL2 and the conductive via CV3. Further, the contact area of the conductive pillar 150 and the conductive via CV1 is greater than the contact area of the redistribution wirings RDL2 and the conductive via CV3.

As illustrated in FIG. 14B, the conductive vias CV1, CV2, and CV3 respectively includes tapered sidewalls. The bottom width CD1 of the conductive via CV1 is less than the top width CD2 of the conductive via CV1. The bottom width CD3 of the conductive via CV2 is less than the top width CD4 of the conductive via CV2. The bottom width CD5 of the conductive via CV3 is less than the top width CD6 of the conductive via CV3. The bottom width CD3 of the conductive via CV2 and the bottom width CD5 of the conductive via CV3 is less than the bottom width CD1 of the conductive via CV1. The top width CD4 of the conductive via CV2 is greater than the bottom width CD1 of the conductive via CV1, and the top width CD4 of the conductive via CV2 is less than the top width CD2 of the conductive via CV1. The top width CD6 of the conductive via CV3 is greater than the bottom width CD3 of the conductive via CV2, and the top width CD6 of the conductive via CV3 is less than the top width CD4 of the conductive via CV2. The bottom width CD1 of the conductive via CV1 may range from about 5 micrometers to about 10 micrometers, wherein a ratio of the bottom width CD3 of the conductive via CV2 and the bottom width CD1 of the conductive via CV1 may range from about 0.7 to about 0.9, and a ratio of the bottom width CD5 of the conductive via CV3 and the bottom width CD3 of the conductive via CV2 may range from about 0.7 to about 0.9. The lateral dimension (e.g., diameter or width) of the pad portion of the redistribution wirings RDL1 may be greater than the top width CD2 of the conductive via CV1. The lateral dimension (e.g., diameter or width) of the pad portion of the redistribution wirings RDL2 may be greater than the top width CD4 of the conductive via CV2. The lateral dimension (e.g., diameter or width) of the pad portion of the redistribution wirings RDL3 may be greater than the top width CD6 of the conductive via CV3. Since the bottom width CD3 of the conductive via CV2 and the bottom width CD5 of the conductive via CV3 are less than the bottom width CD1 of the conductive via CV1, the stacked via structure including the conductive vias CV1, CV2, and CV3 is capable of minimize via crack issue resulted from concentrated stress. As illustrated in FIG. 14B, the conductive vias CV1, CV2, and CV3 are stacked along a stacking direction, and the centerlines of the conductive vias CV1, CV2, and CV3 are aligned in the stacking direction. In some alternative embodiments, not illustrated in figures, the conductive vias are stacked along a stacking direction, and conductive vias are stacked along a stacking direction, and the centerline of at least one conductive vias is not aligned with the centerlines of the rest conductive vias.

As illustrated in FIG. 14B, the contact area of the conductive pillar 150 and the conductive via CV1 is greater than the contact area of the redistribution wirings RDL1 and the conductive via CV2. Further, the contact area of the redistribution wirings RDL1 and the conductive via CV2 is greater than the contact area of the redistribution wirings RDL2 and the conductive via CV3.

Figure 15A:
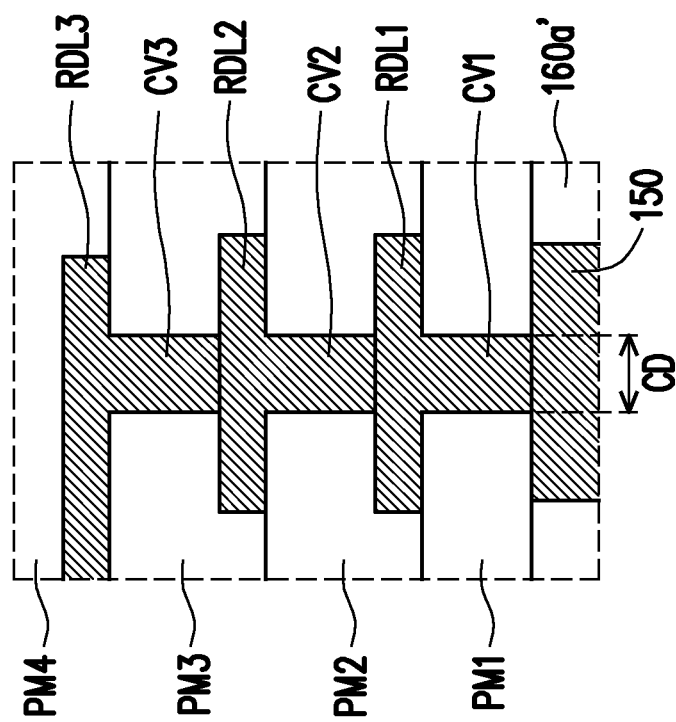

Referring to FIG. 15A, a stacked via structure including a dielectric layer PM1, a conductive via CV1, a redistribution wirings RDL1, a dielectric layer PM2, a conductive via CV2, a redistribution wirings RDL2, a dielectric layer PM3, a conductive via CV3, a redistribution wirings RDL3, and a dielectric layer PM4 is proposed. The dielectric layer PM1 covers the conductive pillar 150 and the protection layer 160a'. The conductive via CV1 is embedded in a via hole defined by the dielectric layer PM1 and electrically connected to the conductive pillar 150. The redistribution wirings RDL1 is electrically connected to the conductive pillars 150 through the conductive via CV1, and the redistribution wirings RDL1 includes a pad portion covering the dielectric layer PM1 and the conductive via CV1. The conductive via CV1 is entirely covered by the pad portion of the redistribution wirings RDL1. The dielectric layer PM2 covers the dielectric layer PM1 and the redistribution wirings RDL1. The conductive via CV2 is embedded in a via hole defined by the dielectric layer PM2 and electrically connected to the redistribution wirings RDL1. The redistribution wirings RDL2 is electrically connected to the redistribution wirings RDL1 through the conductive via CV2, and the redistribution wirings RDL2 includes a pad portion covering the dielectric layer PM2 and the conductive via CV2. The conductive via CV2 is entirely covered by the pad portion of the redistribution wirings RDL2. The dielectric layer PM3 covers the dielectric layer PM2 and the redistribution wirings RDL2. The conductive via CV3 is embedded in a via hole defined by the dielectric layer PM3 and electrically connected to the redistribution wirings RDL2. The redistribution wirings RDL3 is electrically connected to the redistribution wirings RDL2 through the conductive via CV3, and the redistribution wirings RDL3 includes a pad portion covering the dielectric layer PM3 and the conductive via CV3. The conductive via CV3 is entirely covered by the pad portion of the redistribution wirings RDL3. The dielectric layer PM4 covers the dielectric layer PM3 and the redistribution wirings RDL3.

As illustrated in FIG. 15A, the conductive vias CV1, CV2, and CV3 respectively includes vertical sidewalls. The sidewalls of the conductive vias CV1, CV2, and CV3 are substantially aligned. The bottom width CD of the conductive vias CV1, CV2, and CV3 is substantially equal to the top width CD of the conductive vias CV1, CV2, and CV3. The width CD of the conductive vias CV1, CV2, and CV3 may range from about 5 micrometers to about 10 micrometers. The lateral dimension (e.g., diameter or width) of the pad portion of the redistribution wirings RDL1 may be greater than the top width CD of the conductive via CV1. The lateral dimension (e.g., diameter or width) of the pad portion of the redistribution wirings RDL2 may be greater than the top width CD of the conductive via CV2. The lateral dimension (e.g., diameter or width) of the pad portion of the redistribution wirings RDL3 may be greater than the top width CD of the conductive via CV3. Since the conductive vias CV1, CV2, and CV3 respectively includes vertical sidewalls and the width CD of the conductive vias CV1, CV2, and CV3 are substantial equal, the stacked via structure including the conductive vias CV1, CV2, and CV3 is capable of minimize via crack issue resulted from concentrated stress. As illustrated in FIG. 15A, the conductive vias CV1, CV2, and CV3 are stacked along a stacking direction, and the centerlines of the conductive vias CV1, CV2, and CV3 are aligned in the stacking direction. In some alternative embodiments, not illustrated in figures, the conductive vias are stacked along a stacking direction, and the conductive vias are stacked along a stacking direction, and the centerline of at least one conductive vias is not aligned with the centerlines of the rest conductive vias.

As illustrated in FIG. 15A, the contact area of the conductive pillar 150 and the conductive via CV1 is substantially equal to the contact area of the redistribution wirings RDL1 and the conductive via CV1. The contact area the redistribution wirings RDL1 and the conductive via CV1 is substantially equal to the contact area of the conductive via CV2 and the redistribution wirings RDL1. The contact area the redistribution wirings RDL2 and the conductive via CV2 is substantially equal to the contact area of the conductive via CV3 and the redistribution wirings RDL2. Further, the contact area of the conductive via CV3 and the redistribution wirings RDL2 is substantially equal to the contact area of the redistribution wirings RDL3 and the conductive via CV3.

Figure 15B:
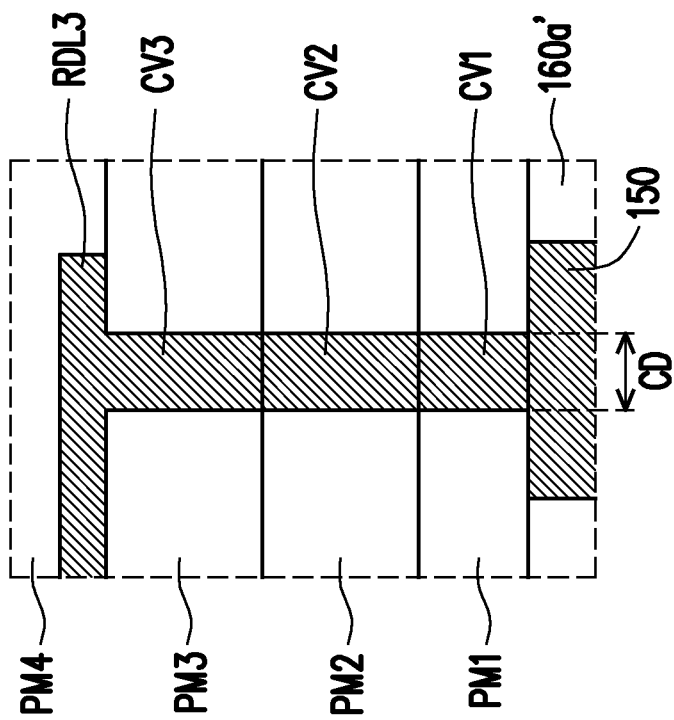

Referring to FIG. 15B, a stacked via structure including a dielectric layer PM1, a conductive via CV1, a dielectric layer PM2, a conductive via CV2, a dielectric layer PM3, a conductive via CV3, and a dielectric layer PM4 is proposed. The dielectric layer PM1 covers the conductive pillar 150 and the protection layer 160a'. The conductive via CV1 is embedded in a via hole defined by the dielectric layer PM1 and electrically connected to the conductive pillar 150. The dielectric layer PM2 covers the dielectric layer PM1. The conductive via CV2 is embedded in a via hole defined by the dielectric layer PM2 and electrically connected to the conductive via CV1. The conductive via CV1 is aligned with and entirely covered by the conductive via CV2. The dielectric layer PM3 covers the dielectric layer PM2. The conductive via CV3 is embedded in a via hole defined by the dielectric layer PM3 and electrically connected to the conductive via CV2. The conductive via CV2 is entirely covered by the conductive via CV3. The dielectric layer PM4 covers the dielectric layer PM3.

As illustrated in FIG. 15B, the conductive vias CV1, CV2, and CV3 respectively includes vertical sidewalls. The sidewalls of the conductive vias CV1, CV2, and CV3 are substantially aligned. The bottom width CD of the conductive vias CV1, CV2, and CV3 is substantially equal to the top width CD of the conductive vias CV1, CV2, and CV3. The width CD of the conductive vias CV1, CV2, and CV3 may range from about 5 micrometers to about 10 micrometers. Since the conductive vias CV1, CV2, and CV3 respectively includes vertical sidewalls and the width CD of the conductive vias CV1, CV2, and CV3 are substantial equal, the stacked via structure including the conductive vias CV1, CV2, and CV3 is capable of minimize via crack issue resulted from concentrated stress. As illustrated in FIG. 15B, the conductive vias CV1, CV2, and CV3 are stacked along a stacking direction, and the centerlines of the conductive vias CV1, CV2, and CV3 are aligned in the stacking direction. In some alternative embodiments, not illustrated in figures, the conductive vias are stacked along a stacking direction, and the conductive vias are stacked along a stacking direction, and the centerline of at least one conductive vias is not aligned with the centerlines of the rest conductive vias.

As illustrated in FIG. 15B, the contact area of the conductive pillar 150 and the conductive via CV1 is substantially equal to the contact area of the conductive via CV1 and the conductive via CV2. The contact area of the conductive via CV1 and the conductive via CV2 is substantially equal to the contact area of the conductive via CV2 and the conductive via CV3. Further, the contact area of the conductive via CV2 and the conductive via CV3 is substantially equal to the contact area of the redistribution wirings RDL3 and the conductive via CV3.

Figure 16:
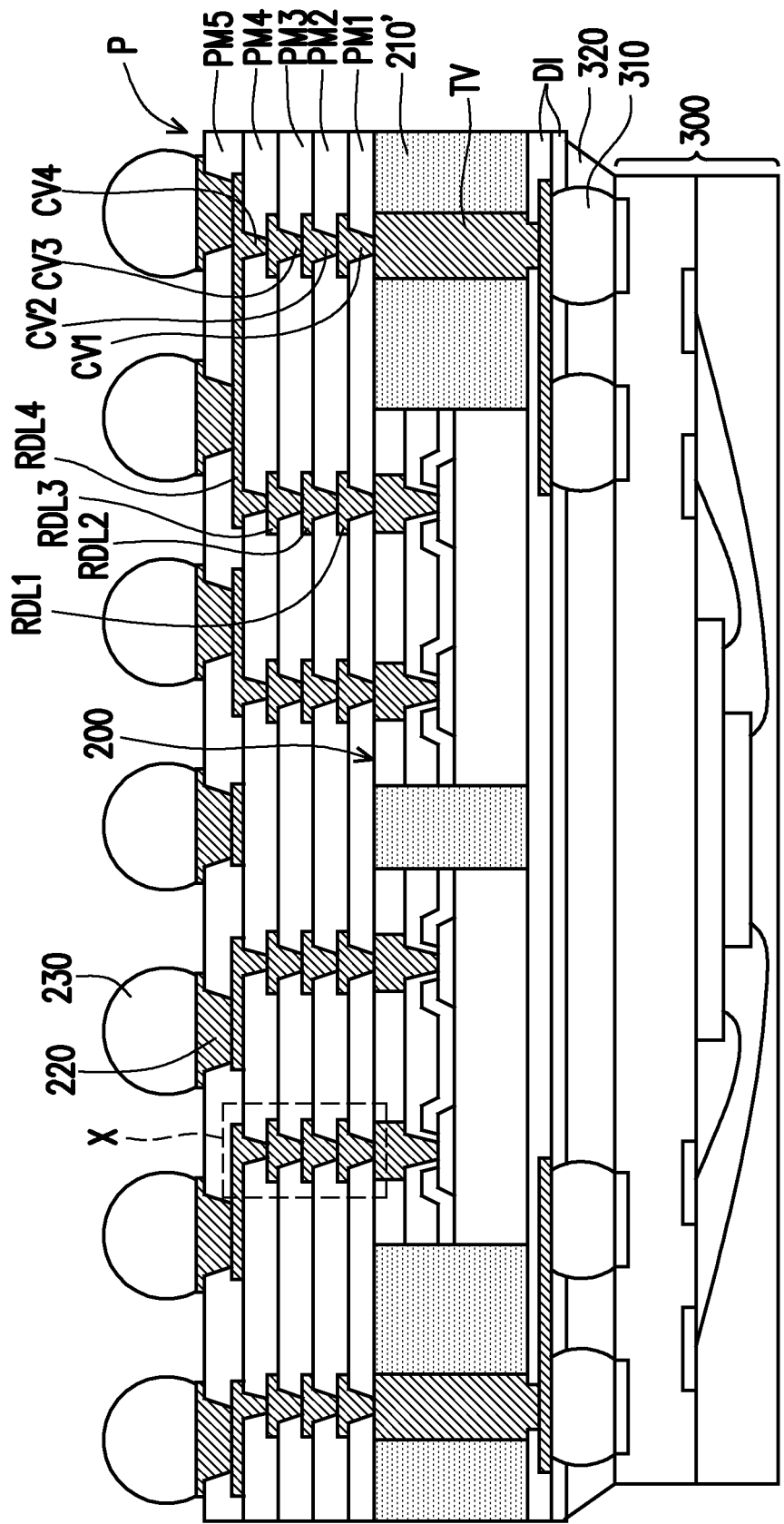
FIG. 16 is a package-on package (PoP) structure in accordance with some alternative embodiments of the present disclosure.

Referring to FIG. 11 and FIG. 16, a PoP structure illustrated in FIG. 16 is similar to the PoP structure illustrated in FIG. 11 except that the front side redistribution circuit structure of the package structure P illustrated in FIG. 16 includes dielectric layers PM1 through PM4, conductive vias CV1 through CV4, and redistribution wirings RDL1 through RDL4. A dielectric layer PM5, conductive pads 220, and conductive terminals 230 are formed over the front side redistribution circuit structure. The dielectric layer PM5 is formed on the dielectric layer PM4 to cover redistribution wirings RDL4. The conductive pads 220 are formed on the dielectric layer PM5 and are electrically connected to the redistribution wirings RDL4. The conductive terminals 230 lands on the conductive pads 220 and electrically connected to the front side redistribution circuit structure through the pads 220. In some embodiments, the conductive pads 220 include under-ball metallurgy (UBM) patterns for ball mount and/or connection pads for mounting of passive components. The dielectric layer PM5 may be formed of nitride such as silicon nitride, oxide such as silicon oxide, PSG, BSG, BPSG, or the like. The material of the dielectric layer PM5 may be identical to or different from the dielectric layers PM1, PM2, PM3, and PM4.

Figure 17A:
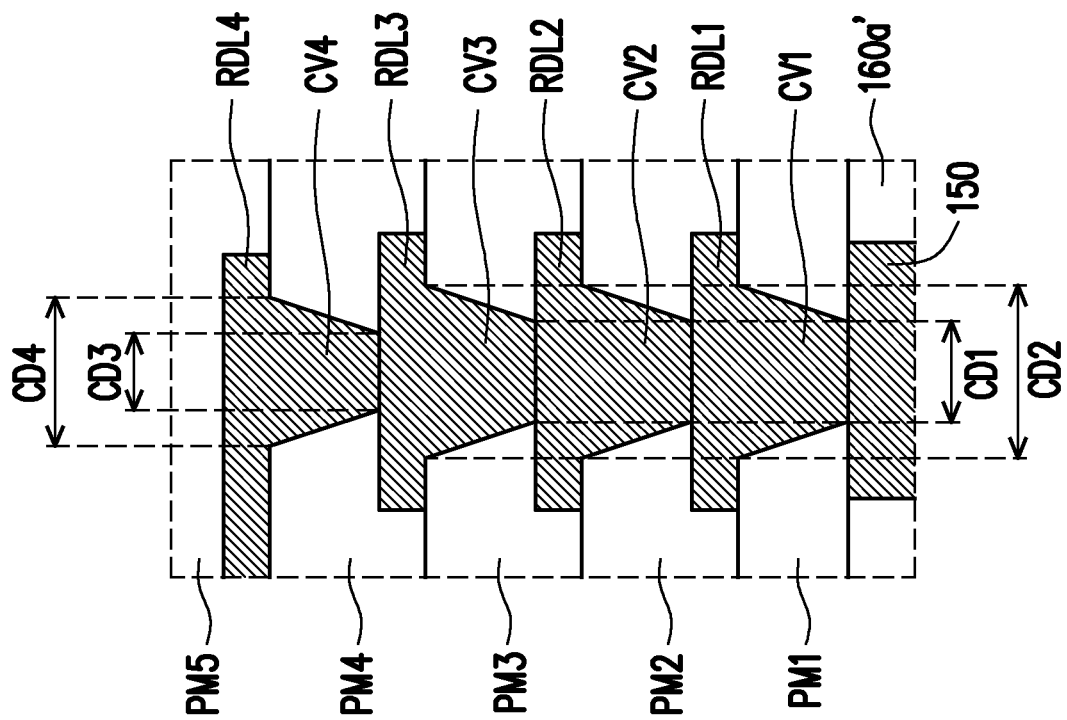
Figure 17B:
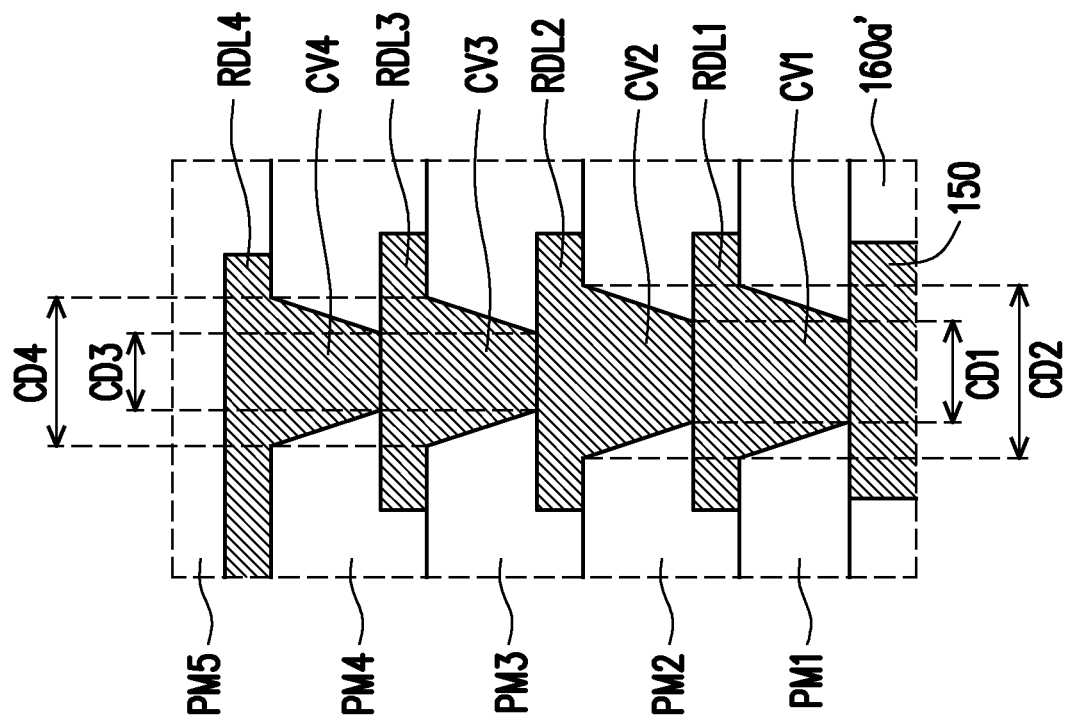
Figure 17C:
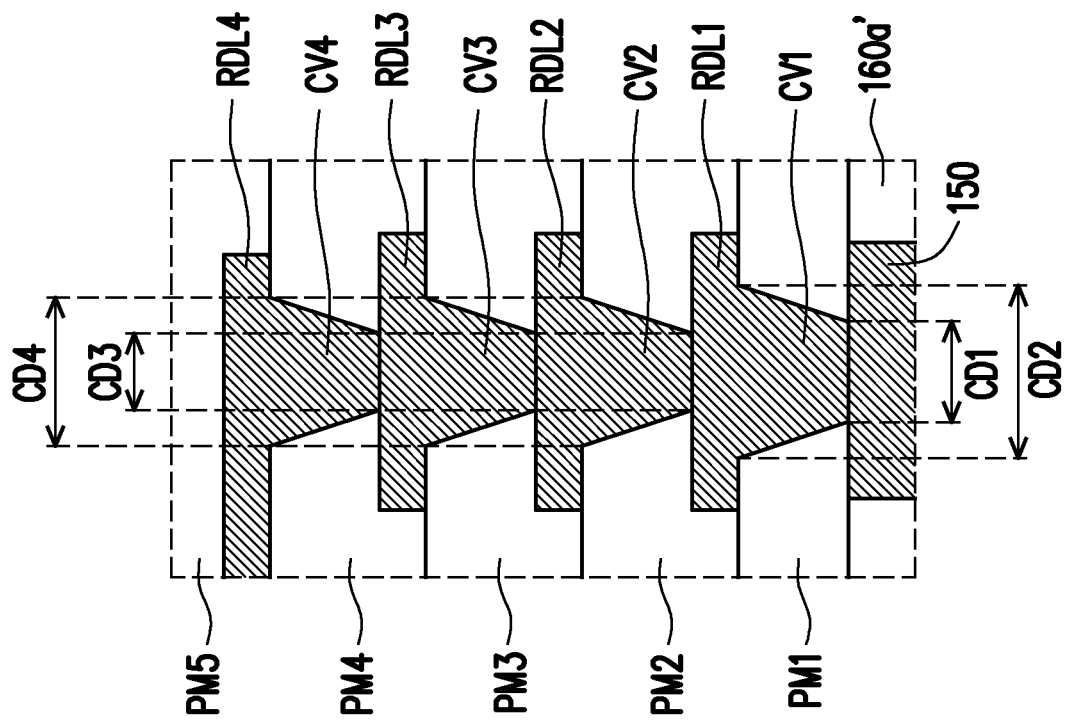

Referring to FIG. 17A through FIG. 17C, a stacked via structure including a dielectric layer PM1, a conductive via CV1, a redistribution wirings RDL1, a dielectric layer PM2, a conductive via CV2, a redistribution wirings RDL2, a dielectric layer PM3, a conductive via CV3, a redistribution wirings RDL3, a dielectric layer PM4, a conductive via CV4, a redistribution wirings RDL4, and a dielectric layer PM5 is proposed. The dielectric layer PM1 covers the conductive pillar 150 and the protection layer 160a'. The conductive via CV1 is embedded in a via hole defined by the dielectric layer PM1 and electrically connected to the conductive pillar 150. The redistribution wirings RDL1 is electrically connected to the conductive pillars 150 through the conductive via CV1, and the redistribution wirings RDL1 includes a pad portion covering the dielectric layer PM1 and the conductive via CV1. The conductive via CV1 is entirely covered by the pad portion of the redistribution wirings RDL1. The dielectric layer PM2 covers the dielectric layer PM1 and the redistribution wirings RDL1. The conductive via CV2 is embedded in a via hole defined by the dielectric layer PM2 and electrically connected to the redistribution wirings RDL1. The redistribution wirings RDL2 is electrically connected to the redistribution wirings RDL1 through the conductive via CV2, and the redistribution wirings RDL2 includes a pad portion covering the dielectric layer PM2 and the conductive via CV2. The conductive via CV2 is entirely covered by the pad portion of the redistribution wirings RDL2. The dielectric layer PM3 covers the dielectric layer PM2 and the redistribution wirings RDL2. The conductive via CV3 is embedded in a via hole defined by the dielectric layer PM3 and electrically connected to the redistribution wirings RDL2. The redistribution wirings RDL3 is electrically connected to the redistribution wirings RDL2 through the conductive via CV3, and the redistribution wirings RDL3 includes a pad portion covering the dielectric layer PM3 and the conductive via CV3. The conductive via CV3 is entirely covered by the pad portion of the redistribution wirings RDL3. The dielectric layer PM4 covers the dielectric layer PM3 and the redistribution wirings RDL3. The dielectric layer PM4 covers the dielectric layer PM3 and the redistribution wirings RDL3. The conductive via CV4 is embedded in a via hole defined by the dielectric layer PM4 and electrically connected to the redistribution wirings RDL3. The redistribution wirings RDL4 is electrically connected to the redistribution wirings RDL3 through the conductive via CV4, and the redistribution wirings RDL4 includes a pad portion covering the dielectric layer PM4 and the conductive via CV4. The conductive via CV4 is entirely covered by the pad portion of the redistribution wirings RDL4.

As illustrated in FIG. 17A, the conductive vias CV1, CV2, CV3, and CV4 respectively includes tapered sidewalls. The bottom width CD1 of the conductive vias CV1 through CV3 is less than the top width CD2 of the conductive vias CV1 through CV3. The bottom width CD3 of the conductive via CV4 is less than the top width CD4 of the conductive via CV4. The bottom width CD3 of the conductive via CV4 is less than the bottom width CD1 of the conductive vias CV1 through CV3. The top width CD4 of the conductive via CV4 is greater than the bottom width CD1 of the conductive vias CV1 through CV3, and the top width CD4 of the conductive via CV4 is less than the top width CD2 of the conductive vias CV1 through CV3. The bottom width CD1 of the conductive vias CV1 through CV3 may range from about 5 micrometers to about 10 micrometers, and a ratio of the bottom width CD3 of the conductive via CV4 and the bottom width CD1 of the conductive vias CV1 through CV3 may range from about 0.7 to about 0.9. The lateral dimension (e.g., diameter or width) of the pad portion of the redistribution wirings RDL1 may be greater than the top width CD2 of the conductive via CV1. The lateral dimension (e.g., diameter or width) of the pad portion of the redistribution wirings RDL2 may be greater than the top width CD2 of the conductive via CV2. The lateral dimension (e.g., diameter or width) of the pad portion of the redistribution wirings RDL3 may be greater than the top width CD2 of the conductive via CV3. The lateral dimension (e.g., diameter or width) of the pad portion of the redistribution wirings RDL4 may be greater than the top width CD4 of the conductive via CV4. Since the bottom width CD3 of the conductive via CV4 is less than the bottom width CD1 of the conductive vias CV1 through CV3, the stacked via structure including the conductive vias CV1, CV2, CV3, and CV4 is capable of minimize via crack issue resulted from concentrated stress. As illustrated in FIG. 17A, the conductive vias CV1, CV2, CV3, and CV4 are stacked along a stacking direction, and the centerlines of the conductive vias CV1, CV2, CV3, and CV4 are aligned in the stacking direction. In some alternative embodiments, not illustrated in figures, the conductive vias are stacked along a stacking direction, and the conductive vias are stacked along a stacking direction, and the centerline of at least one conductive vias is not aligned with the centerlines of the rest conductive vias.

As illustrated in FIG. 17A, the contact area of the conductive pillar 150 and the conductive via CV1 is substantially equal to the contact area of the conductive via CV2 and the redistribution wirings RDL1. The contact area of the conductive via CV2 and the redistribution wirings RDL1 is substantially equal to the contact area of the conductive via CV3 and the redistribution wirings RDL2. Further, the contact area of the conductive via CV3 and the redistribution wirings RDL2 is greater than the contact area of the conductive via CV4 and the redistribution wirings RDL3.

As illustrated in FIG. 17B, the conductive vias CV1, CV2, CV3, and CV4 respectively includes tapered sidewalls. The bottom width CD1 of the conductive vias CV1 and CV2 is less than the top width CD2 of the conductive vias CV1 and CV2. The bottom width CD3 of the conductive vias CV3 and CV4 is less than the top width CD4 of the conductive vias CV3 and CV4. The bottom width CD3 of the conductive vias CV3 and CV4 is less than the bottom width CD1 of the conductive vias CV1 and CV2. The top width CD4 of the conductive vias CV3 and CV4 is greater than the bottom width CD1 of the conductive vias CV1 and CV2, and the top width CD4 of the conductive vias CV3 and CV4 is less than the top width CD2 of the conductive vias CV1 and CV2. The bottom width CD1 of the conductive vias CV1 and CV2 may range from about 5 micrometers to about 10 micrometers, and a ratio of the bottom width CD3 of the conductive vias CV3 and CV4 and the bottom width CD1 of the conductive vias CV1 and CV2 may range from about 0.7 to about 0.9. The lateral dimension (e.g., diameter or width) of the pad portion of the redistribution wirings RDL1 may be greater than the top width CD2 of the conductive via CV1. The lateral dimension (e.g., diameter or width) of the pad portion of the redistribution wirings RDL2 may be greater than the top width CD2 of the conductive via CV2. The lateral dimension (e.g., diameter or width) of the pad portion of the redistribution wirings RDL3 may be greater than the top width CD2 of the conductive via CV3. The lateral dimension (e.g., diameter or width) of the pad portion of the redistribution wirings RDL4 may be greater than the top width CD4 of the conductive via CV4. Since the bottom width CD3 of the conductive vias CV3 and CV4 is less than the bottom width CD1 of the conductive vias CV1 and CV2, the stacked via structure including the conductive vias CV1, CV2, CV3, and CV4 is capable of minimize via crack issue resulted from concentrated stress. As illustrated in FIG. 17B, the conductive vias CV1, CV2, CV3, and CV4 are stacked along a stacking direction, and the centerlines of the conductive vias CV1, CV2, CV3, and CV4 are aligned in the stacking direction. In some alternative embodiments, not illustrated in figures, the conductive vias are stacked along a stacking direction, and the conductive vias are stacked along a stacking direction, and the centerline of at least one conductive vias is not aligned with the centerlines of the rest conductive vias.

As illustrated in FIG. 17B, the contact area of the conductive pillar 150 and the conductive via CV1 is substantially equal to the contact area of the conductive via CV2 and the redistribution wirings RDL1. The contact area of the conductive via CV2 and the redistribution wirings RDL1 is greater than the contact area of the conductive via CV3 and the redistribution wirings RDL2. Further, the contact area of the conductive via CV3 and the redistribution wirings RDL2 is substantially equal to the contact area of the conductive via CV4 and the redistribution wirings RDL3.

As illustrated in FIG. 17C, the conductive vias CV1, CV2, CV3, and CV4 respectively includes tapered sidewalls. The bottom width CD1 of the conductive via CV1 is less than the top width CD2 of the conductive vias CV2 through CV4. The bottom width CD3 of the conductive vias CV2 through CV4 is less than the top width CD4 of the conductive vias CV2 through CV4. The bottom width CD3 of the conductive vias CV2 through CV4 is less than the bottom width CD1 of the conductive via CV1. The top width CD4 of the conductive vias CV2 through CV4 is greater than the bottom width CD1 of the conductive via CV1, and the top width CD4 of the conductive vias CV2 through CV4 is less than the top width CD2 of the conductive via CV1. The bottom width CD1 of the conductive via CV1 may range from about 5 micrometers to about 10 micrometers, and a ratio of the bottom width CD3 of the conductive vias CV2 through CV4 and the bottom width CD1 of the conductive via CV1 may range from about 0.7 to about 0.9. The lateral dimension (e.g., diameter or width) of the pad portion of the redistribution wirings RDL1 may be greater than the top width CD2 of the conductive via CV1. The lateral dimension (e.g., diameter or width) of the pad portion of the redistribution wirings RDL2 may be greater than the top width CD4 of the conductive via CV2. The lateral dimension (e.g., diameter or width) of the pad portion of the redistribution wirings RDL3 may be greater than the top width CD4 of the conductive via CV3. The lateral dimension (e.g., diameter or width) of the pad portion of the redistribution wirings RDL4 may be greater than the top width CD4 of the conductive via CV4. Since the bottom width CD3 of the conductive vias CV2 through CV4 is less than the bottom width CD1 of the conductive via CV1, the stacked via structure including the conductive vias CV1, CV2, CV3, and CV4 is capable of minimize via crack issue resulted from concentrated stress. As illustrated in FIG. 17C, the conductive vias CV1, CV2, CV3, and CV4 are stacked along a stacking direction, and the centerlines of the conductive vias CV1, CV2, CV3, and CV4 are aligned in the stacking direction. In some alternative embodiments, not illustrated in figures, the conductive vias are stacked along a stacking direction, and the conductive vias are stacked along a stacking direction, and the centerline of at least one conductive vias is not aligned with the centerlines of the rest conductive vias.

As illustrated in FIG. 17C, the contact area of the conductive pillar 150 and the conductive via CV1 is greater than the contact area of the conductive via CV2 and the redistribution wirings RDL1. The contact area of the conductive via CV2 and the redistribution wirings RDL1 is substantially equal to the contact area of the conductive via CV3 and the redistribution wirings RDL2. Further, the contact area of the conductive via CV3 and the redistribution wirings RDL2 is substantially equal to the contact area of the conductive via CV4 and the redistribution wirings RDL3.

As illustrated in FIG. 18A, the conductive vias CV1, CV2, CV3, and CV4 respectively includes tapered sidewalls. The bottom width CD1 of the conductive vias CV1 and CV2 is less than the top width CD2 of the conductive vias CV1 and CV2. The bottom width CD3 of the conductive via CV3 is less than the top width CD4 of the conductive via CV3. The bottom width CD5 of the conductive via CV4 is less than the top width CD6 of the conductive via CV4. The bottom width CD5 of the conductive via CV4 is less than the bottom width CD3 of the conductive via CV3, and the bottom width CD3 of the conductive via CV3 is less than the bottom width CD1 of the conductive vias CV1 and CV2. The top width CD4 of the conductive via CV3 is greater than the bottom width CD1 of the conductive vias CV1 and CV2, and the top width CD4 of the conductive via CV3 is less than the top width CD2 of the conductive vias CV1 and CV2. The top width CD6 of the conductive via CV4 is greater than the bottom width CD3 of the conductive via CV3, and the top width CD6 of the conductive via CV4 is less than the top width CD4 of the conductive via CV3. The bottom width CD1 of the conductive vias CV1 and CV2 may range from about 5 micrometers to about 10 micrometers, wherein a ratio of the bottom width CD3 of the conductive via CV3 and the bottom width CD1 of the conductive vias CV1 may range from about 0.7 to about 0.9, and a ratio of the bottom width CD5 of the conductive via CV4 and the bottom width CD3 of the conductive via CV3 may range from about 0.7 to about 0.9. The lateral dimension (e.g., diameter or width) of the pad portion of the redistribution wirings RDL1 may be greater than the top width CD2 of the conductive via CV1. The lateral dimension (e.g., diameter or width) of the pad portion of the redistribution wirings RDL2 may be greater than the top width CD4 of the conductive via CV2. The lateral dimension (e.g., diameter or width) of the pad portion of the redistribution wirings RDL3 may be greater than the top width CD4 of the conductive via CV3. The lateral dimension (e.g., diameter or width) of the pad portion of the redistribution wirings RDL4 may be greater than the top width CD6 of the conductive via CV4. Since the bottom width CD3 of the conductive vias CV2 and the bottom width CD5 of the conductive via CV4 are less than the bottom width CD1 of the conductive via CV1, the stacked via structure including the conductive vias CV1, CV2, CV3 and CV4 is capable of minimize via crack issue resulted from concentrated stress. As illustrated in FIG. 18A, the conductive vias CV1, CV2, CV3, and CV4 are stacked along a stacking direction, and the centerlines of the conductive vias CV1, CV2, CV3, and CV4 are aligned in the stacking direction. In some alternative embodiments, not illustrated in figures, the conductive vias are stacked along a stacking direction, and the conductive vias are stacked along a stacking direction, and the centerline of at least one conductive vias is not aligned with the centerlines of the rest conductive vias.

As illustrated in FIG. 18A, the contact area of the conductive pillar 150 and the conductive via CV1 is substantially equal to the contact area of the conductive via CV2 and the redistribution wirings RDL1. The contact area of the conductive via CV2 and the redistribution wirings RDL1 is greater than the contact area of the conductive via CV3 and the redistribution wirings RDL2. Further, the contact area of the conductive via CV3 and the redistribution wirings RDL2 is greater than the contact area of the conductive via CV4 and the redistribution wirings RDL3.

Figure 18B:
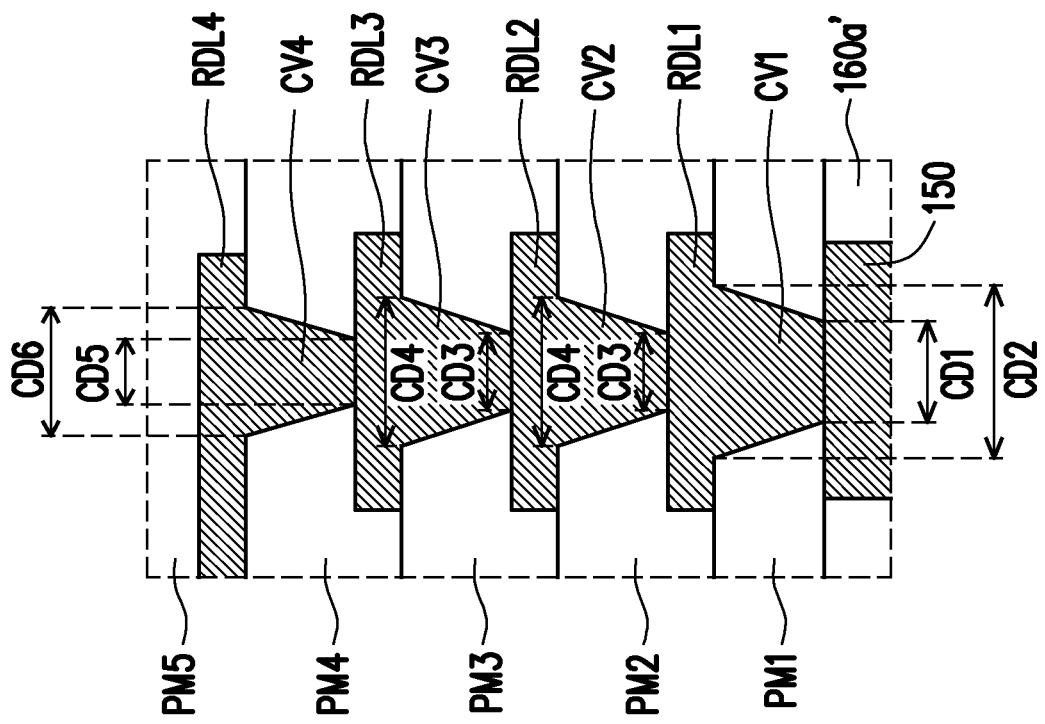

As illustrated in FIG. 18B, the conductive vias CV1, CV2, CV3, and CV4 respectively includes tapered sidewalls. The bottom width CD1 of the conductive via CV1 is less than the top width CD2 of the conductive via CV1. The bottom width CD3 of the conductive vias CV2 and CV3 is less than the top width CD4 of the conductive vias CV2 and CV3. The bottom width CD5 of the conductive via CV4 is less than the top width CD6 of the conductive via CV4. The bottom width CD5 of the conductive via CV4 is less than the bottom width CD3 of the conductive vias CV2 and CV3, and the bottom width CD3 of the conductive vias CV2 and CV3 is less than the bottom width CD1 of the conductive via CV1. The top width CD4 of the conductive vias CV2 and CV3 is greater than the bottom width CD1 of the conductive via CV1, and the top width CD4 of the conductive vias CV2 and CV3 is less than the top width CD2 of the conductive via CV1. The top width CD6 of the conductive via CV4 is greater than the bottom width CD3 of the conductive vias CV2 and CV3, and the top width CD6 of the conductive via CV4 is less than the top width CD4 of the conductive vias CV2 and CV3. The bottom width CD1 of the conductive via CV1 may range from about 5 micrometers to about 10 micrometers, wherein a ratio of the bottom width CD3 of the conductive via CV2 and the bottom width CD1 of the conductive via CV1 may range from about 0.7 to about 0.9, and a ratio of the bottom width CD5 of the conductive via CV4 and the bottom width CD3 of the conductive via CV2 may range from about 0.7 to about 0.9. The lateral dimension (e.g., diameter or width) of the pad portion of the redistribution wirings RDL1 may be greater than the top width CD2 of the conductive via CV1. The lateral dimension (e.g., diameter or width) of the pad portion of the redistribution wirings RDL2 may be greater than the top width CD4 of the conductive via CV2. The lateral dimension (e.g., diameter or width) of the pad portion of the redistribution wirings RDL3 may be greater than the top width CD4 of the conductive via CV3. The lateral dimension (e.g., diameter or width) of the pad portion of the redistribution wirings RDL4 may be greater than the top width CD6 of the conductive via CV4. Since the bottom width CD3 of the conductive vias CV2 and CV3 and the bottom width CD5 of the conductive via CV4 are less than the bottom width CD1 of the conductive via CV1, the stacked via structure including the conductive vias CV1, CV2, CV3 and CV4 is capable of minimize via crack issue resulted from concentrated stress. As illustrated in FIG. 18B, the conductive vias CV1, CV2, CV3, and CV4 are stacked along a stacking direction, and the centerlines of the conductive vias CV1, CV2, CV3, and CV4 are aligned in the stacking direction. In some alternative embodiments, not illustrated in figures, the conductive vias are stacked along a stacking direction, and the conductive vias are stacked along a stacking direction, and the centerline of at least one conductive vias is not aligned with the centerlines of the rest conductive vias.

As illustrated in FIG. 18B, the contact area of the conductive pillar 150 and the conductive via CV1 is greater than the contact area of the conductive via CV2 and the redistribution wirings RDL1. The contact area of the conductive via CV2 and the redistribution wirings RDL1 is substantially equal to the contact area of the conductive via CV3 and the redistribution wirings RDL2. Further, the contact area of the conductive via CV3 and the redistribution wirings RDL2 is greater than the contact area of the conductive via CV4 and the redistribution wirings RDL3.

Figure 18C:
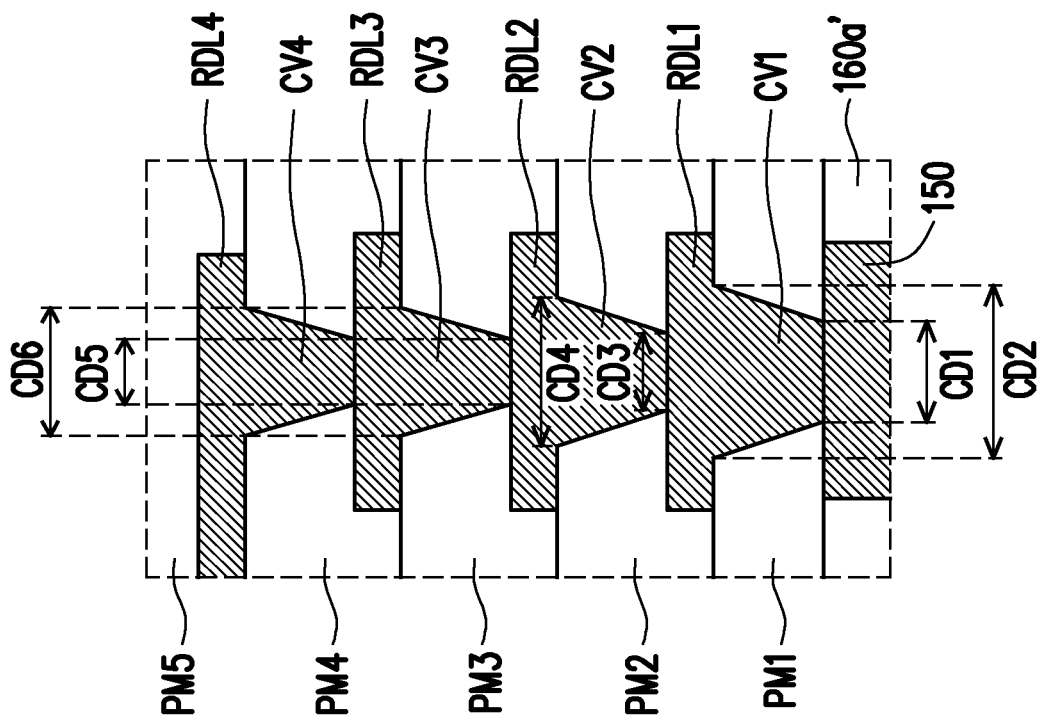

As illustrated in FIG. 18C, the conductive vias CV1, CV2, CV3, and CV4 respectively includes tapered sidewalls. The bottom width CD1 of the conductive via CV1 is less than the top width CD2 of the conductive via CV1. The bottom width CD3 of the conductive via CV2 is less than the top width CD4 of the conductive via CV2. The bottom width CD5 of the conductive vias CV3 and CV4 is less than the top width CD6 of the conductive vias CV3 and CV4. The bottom width CD5 of the conductive vias CV3 and CV4 is less than the bottom width CD3 of the conductive via CV2, and the bottom width CD3 of the conductive via CV2 is less than the bottom width CD1 of the conductive via CV1. The top width CD4 of the conductive via CV2 is greater than the bottom width CD1 of the conductive via CV1, and the top width CD4 of the conductive via CV2 is less than the top width CD2 of the conductive via CV1. The top width CD6 of the conductive vias CV3 and CV4 is greater than the bottom width CD3 of the conductive via CV2, and the top width CD6 of the conductive vias CV3 and CV4 is less than the top width CD4 of the conductive via CV2. The bottom width CD1 of the conductive via CV1 may range from about 5 micrometers to about 10 micrometers, wherein a ratio of the bottom width CD3 of the conductive via CV2 and the bottom width CD1 of the conductive via CV1 may range from about 0.7 to about 0.9, and a ratio of the bottom width CD5 of the conductive vias CV3 and the bottom width CD3 of the conductive via CV2 may range from about 0.7 to about 0.9. The lateral dimension (e.g., diameter or width) of the pad portion of the redistribution wirings RDL1 may be greater than the top width CD2 of the conductive via CV1.

The lateral dimension (e.g., diameter or width) of the pad portion of the redistribution wirings RDL2 may be greater than the top width CD4 of the conductive via CV2. The lateral dimension (e.g., diameter or width) of the pad portion of the redistribution wirings RDL3 may be greater than the top width CD6 of the conductive via CV3. The lateral dimension (e.g., diameter or width) of the pad portion of the redistribution wirings RDL4 may be greater than the top width CD6 of the conductive via CV4. Since the bottom width CD3 of the conductive via CV2 and the bottom width CD5 of the conductive vias CV3 and CV4 are less than the bottom width CD1 of the conductive via CV1, the stacked via structure including the conductive vias CV1, CV2, CV3 and CV4 is capable of minimize via crack issue resulted from concentrated stress. As illustrated in FIG. 18C, the conductive vias CV1, CV2, CV3, and CV4 are stacked along a stacking direction, and the centerlines of the conductive vias CV1, CV2, CV3, and CV4 are aligned in the stacking direction. In some alternative embodiments, not illustrated in figures, the conductive vias are stacked along a stacking direction, and the conductive vias are stacked along a stacking direction, and the centerline of at least one conductive vias is not aligned with the centerlines of the rest conductive vias.

As illustrated in FIG. 18C, the contact area of the conductive pillar 150 and the conductive via CV1 is greater than the contact area of the conductive via CV2 and the redistribution wirings RDL1. The contact area of the conductive via CV2 and the redistribution wirings RDL1 is greater than the contact area of the conductive via CV3 and the redistribution wirings RDL2. Further, the contact area of the conductive via CV3 and the redistribution wirings RDL2 is substantially equal to the contact area of the conductive via CV4 and the redistribution wirings RDL3.

Figure 19:
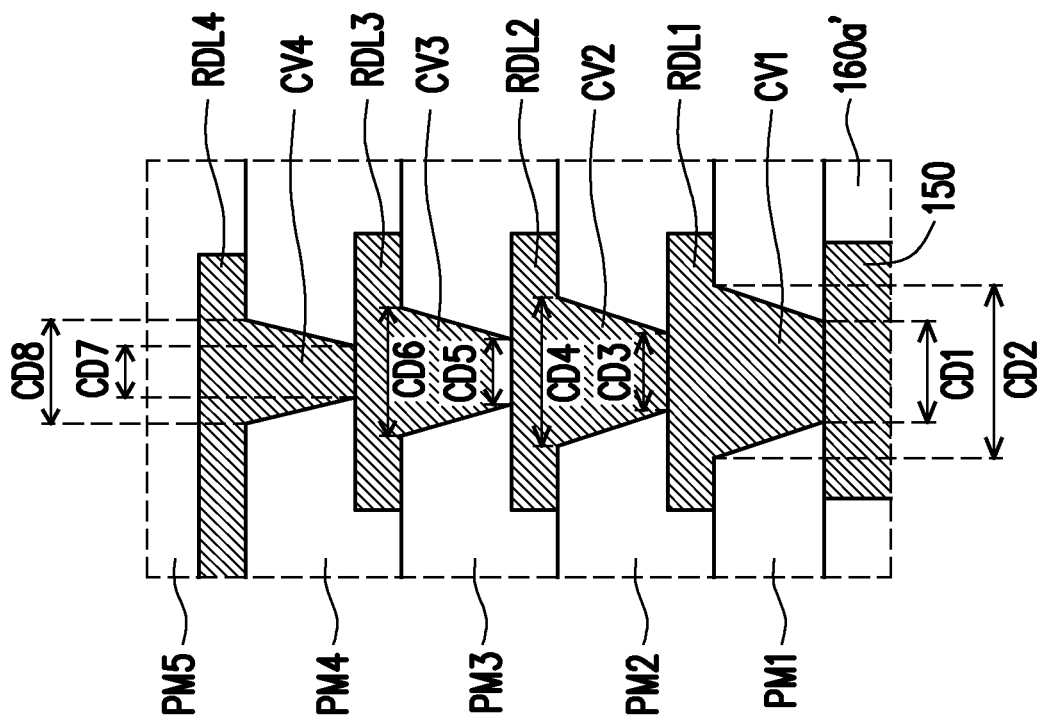

As illustrated in FIG. 19, the conductive vias CV1, CV2, CV3, and CV4 respectively includes tapered sidewalls. The bottom width CD1 of the conductive via CV1 is less than the top width CD2 of the conductive via CV1. The bottom width CD3 of the conductive via CV2 is less than the top width CD4 of the conductive via CV2. The bottom width CD5 of the conductive via CV3 is less than the top width CD6 of the conductive via CV3. The bottom width CD7 of the conductive via CV4 is less than the top width CD8 of the conductive via CV4. The bottom width CD7 of the conductive via CV4 is less than the bottom width CD5 of the conductive via CV3, the bottom width CD5 of the conductive via CV3 is less than the bottom width CD3 of the conductive via CV2, and the bottom width CD3 of the conductive via CV2 is less than the bottom width CD1 of the conductive via CV1. The top width CD4 of the conductive via CV2 is greater than the bottom width CD1 of the conductive via CV1, and the top width CD4 of the conductive via CV2 is less than the top width CD2 of the conductive via CV1. The top width CD6 of the conductive via CV3 is greater than the bottom width CD3 of the conductive via CV2, and the top width CD6 of the conductive via CV3 is less than the top width CD4 of the conductive via CV2. The top width CD8 of the conductive via CV4 is greater than the bottom width CD5 of the conductive via CV3, and the top width CD8 of the conductive via CV4 is less than the top width CD6 of the conductive via CV3. The bottom width CD1 of the conductive via CV1 may range from about 5 micrometers to about 10 micrometers, wherein a ratio of the bottom width CD3 of the conductive via CV2 and the bottom width CD1 of the conductive via CV1 may range from about 0.7 to about 0.9, a ratio of the bottom width CD5 of the conductive via CV3 and the bottom width CD3 of the conductive via CV2 may range from about 0.7 to about 0.9, and a ratio of the bottom width CD7 of the conductive via CV4 and the bottom width CD5 of the conductive via CV3 may range from about 0.7 to about 0.9. The lateral dimension (e.g., diameter or width) of the pad portion of the redistribution wirings RDL1 may be greater than the top width CD2 of the conductive via CV1. The lateral dimension (e.g., diameter or width) of the pad portion of the redistribution wirings RDL2 may be greater than the top width CD4 of the conductive via CV2. The lateral dimension (e.g., diameter or width) of the pad portion of the redistribution wirings RDL3 may be greater than the top width CD6 of the conductive via CV3. The lateral dimension (e.g., diameter or width) of the pad portion of the redistribution wirings RDL4 may be greater than the top width CD6 of the conductive via CV4. Since the bottom width CD3, CD5 and CD7 of the conductive vias CV2, CV3 and CV4 are less than the bottom width CD1 of the conductive via CV1, the stacked via structure including the conductive vias CV1, CV2, CV3 and CV4 is capable of minimize via crack issue resulted from concentrated stress. As illustrated in FIG. 19, the conductive vias CV1, CV2, CV3, and CV4 are stacked along a stacking direction, and the centerlines of the conductive vias CV1, CV2, CV3, and CV4 are aligned in the stacking direction. In some alternative embodiments, not illustrated in figures, the conductive vias are stacked along a stacking direction, and the conductive vias are stacked along a stacking direction, and the centerline of at least one conductive vias is not aligned with the centerlines of the rest conductive vias.

As illustrated in FIG. 19, the contact area of the conductive pillar 150 and the conductive via CV1 is greater than the contact area of the conductive via CV2 and the redistribution wirings RDL1. The contact area of the conductive via CV2 and the redistribution wirings RDL1 is greater than the contact area of the conductive via CV3 and the redistribution wirings RDL2. Further, the contact area of the conductive via CV3 and the redistribution wirings RDL2 is greater than the contact area of the conductive via CV4 and the redistribution wirings RDL3.

In the above-mentioned embodiments, since the width of an upper tiered conductive via is not less than the width of a lower tiered conductive via, the structural strength of the stacked via structure may be enhanced.

In accordance with some embodiments of the disclosure, a stacked via structure disposed on a conductive pillar of a semiconductor die is provided. The stacked via structure includes a first dielectric layer, a first conductive via, a first redistribution wiring, a second dielectric layer, a second conductive via, and a second redistribution wiring. The first dielectric layer covers the semiconductor die. The first conductive via is embedded in the first dielectric layer and electrically connected to the conductive pillar of the semiconductor die. The first redistribution wiring covers a top surface of the first conductive via and a top surface of the first dielectric layer. The second dielectric layer covers the first dielectric layer and the first redistribution wiring. The second conductive via is embedded in the second dielectric layer and landed on the first redistribution wiring. The second redistribution wiring covers a top surface of the second conductive via and a top surface of the second dielectric layer, and a first lateral dimension of the first conductive via is greater than a second lateral dimension of the second conductive via. In some embodiments, the stacked via structure further includes a third dielectric layer, a third conductive via, and a third redistribution wiring. The third dielectric layer covers the second dielectric layer and the second redistribution wiring. The third conductive via is embedded in the third dielectric layer and landed on the second redistribution wiring. The third redistribution wiring covers a top surface of the third conductive via and a top surface of the third dielectric layer. In some embodiments, the second lateral dimension of the second conductive via is greater than a third lateral dimension of the third conductive via. In some embodiments, the second lateral dimension of the second conductive via is equal to a third lateral dimension of the third conductive via. In some embodiments, the stacked via structure further includes a fourth dielectric layer, a fourth conductive via, and a fourth redistribution wiring. The fourth dielectric layer covers the third dielectric layer and the third redistribution wiring. The fourth conductive via is embedded in the fourth dielectric layer and landed on the third redistribution wiring. The fourth redistribution wiring covers a top surface of the fourth conductive via and a top surface of the fourth dielectric layer. In some embodiments, the third lateral dimension of the third conductive via is greater than a fourth lateral dimension of the fourth conductive via. In some embodiments, the third lateral dimension of the third conductive via is equal to a fourth lateral dimension of the fourth conductive via. In some embodiments, the first conductive via comprises first tapered sidewalls, and the second conductive via comprises second tapered sidewalls. In some embodiments, the first conductive via comprises first vertical sidewalls, and the second conductive via comprises second vertical sidewalls. In some embodiments, a first centerline of the first conductive via is aligned with a second centerline of the second conductive via. In some embodiments, a first centerline of the first conductive via is offset from a second centerline of the second conductive via.

In accordance with some embodiments of the disclosure, a stacked via structure disposed on a conductive pillar of a semiconductor die is provided. The stacked via structure includes a first dielectric layer, a first conductive via, a first redistribution wiring, a second dielectric layer, a second conductive via, and a second redistribution wiring. The first dielectric layer covers the semiconductor die. The first conductive via is embedded in the first dielectric layer and landed on the conductive pillar of the semiconductor die. The first redistribution wiring covers a top surface of the first conductive via and a top surface of the first dielectric layer. The second dielectric layer covers the first dielectric layer and the first redistribution wiring. The second conductive via is embedded in the second dielectric layer and landed on the first redistribution wiring. The second redistribution wiring covers a top surface of the second conductive via and a top surface of the second dielectric layer, and a first contact area of the first conductive via and the conductive pillar is greater than a second contact area of the second conductive via and the first redistribution wiring. In some embodiments, the stacked via structure further includes a third dielectric layer, a third conductive via, and a third redistribution wiring. The third dielectric layer covers the second dielectric layer and the second redistribution wiring. The third conductive via is embedded in the third dielectric layer and landed on the second redistribution wiring. The third redistribution wiring covers a top surface of the third conductive via and a top surface of the third dielectric layer, and the second contact area is greater than or equal to a third contact area of the third conductive via and the second redistribution wiring. In some embodiments, the stacked via structure further includes a fourth dielectric layer, a fourth conductive via, and a fourth redistribution wiring. The fourth dielectric layer covers the third dielectric layer and the third redistribution wiring. The fourth conductive via is embedded in the fourth dielectric layer and landed on the third redistribution wiring. The fourth redistribution wiring covers a top surface of the fourth conductive via and a top surface of the fourth dielectric layer, and the third contact area is greater than or equal to a fourth contact area of the fourth conductive via and the third redistribution wiring. In some embodiments, the first conductive via comprises tapered sidewalls or vertical sidewalls, and the second conductive via comprises tapered sidewalls or vertical sidewalls. In some embodiments, a first centerline of the first conductive via is aligned with a second centerline of the second conductive via. In some embodiments, a first centerline of the first conductive via is offset from a second centerline of the second conductive via.

In accordance with some embodiments of the disclosure, a stacked via structure including stacked dielectric layers, a first conductive via, and a second conductive via is providing. The stacked dielectric layers cover a semiconductor die laterally encapsulated by an insulating encapsulation. The first conductive via penetrates through a first dielectric layer among the stacked dielectric layers. The first conductive via is landed on and electrically connected to a conductive pillar of the semiconductor die. The second conductive via penetrates through a second dielectric layer among the stacked dielectric layers. The second dielectric layer covers the first dielectric layer. The second conductive via is electrically connected to the first conductive via. A first width of the first conductive via is substantially equal to a second width of the second conductive via. In some embodiments, the first conductive via is landed on the second conductive via, the first conductive via and the second conductive via are stacked along a stacking direction, a first centerline of the first conductive via is aligned with a second centerline of the second conductive via in the stacking direction, and first vertical sidewalls of the first conductive via are aligned with second vertical sidewalls of the second conductive via in the stacking direction. In some embodiments, the stacked via structure further includes a redistribution wiring disposed between the first conductive via and the second conductive via, wherein the redistribution wiring covers the first conductive via and the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacked via structure, disposed on a conductive pillar of a semiconductor die, the stacked via structure comprising:
   a first dielectric layer disposed on the semiconductor die;
   a first conductive via embedded in the first dielectric layer, wherein the first conductive via is in physical contact with the conductive pillar of the semiconductor die;
   a first redistribution wiring disposed on the first conductive via and the first dielectric layer;
   a second dielectric layer disposed over the first dielectric layer and the first redistribution wiring;
   a second conductive via embedded in the second dielectric layer, wherein the second conductive via is electrically connected to the conductive pillar of the semiconductor die through the first redistribution wiring; and
   a second redistribution wiring disposed on the second conductive via and the second dielectric layer, wherein a first lateral dimension of the first conductive via is greater than a second lateral dimension of the second conductive via.

2. The stacked via structure as claimed in claim 1 further comprising:
   a third dielectric layer disposed on the second dielectric layer and the second redistribution wiring;
   a third conductive via embedded in the third dielectric layer and landed on the second redistribution wiring; and
   a third redistribution wiring disposed on the third conductive via and the third dielectric layer.

3. The stacked via structure as claimed in claim 2, wherein the second lateral dimension of the second conductive via is greater than a third lateral dimension of the third conductive via.

4. The stacked via structure as claimed in claim 2, wherein the second lateral dimension of the second conductive via is substantially equal to a third lateral dimension of the third conductive via.

5. The stacked via structure as claimed in claim 2 further comprising:
   a fourth dielectric layer disposed on the third dielectric layer and the third redistribution wiring;
   a fourth conductive via embedded in the fourth dielectric layer and landed on the third redistribution wiring; and
   a fourth redistribution wiring disposed on the fourth conductive via and the fourth dielectric layer.

6. The stacked via structure as claimed in claim 5, wherein the third lateral dimension of the third conductive via is greater than a fourth lateral dimension of the fourth conductive via.

7. The stacked via structure as claimed in claim 5, wherein the third lateral dimension of the third conductive via is substantially equal to a fourth lateral dimension of the fourth conductive via.

8. The stacked via structure as claimed in claim 1, wherein the first conductive via comprises first tapered sidewalls, and the second conductive via comprises second tapered sidewalls.

9. The stacked via structure as claimed in claim 1, wherein the first conductive via comprises first vertical sidewalls, and the second conductive via comprises second vertical sidewalls.

10. The stacked via structure as claimed in claim 1, wherein a first centerline of the first conductive via is substantially aligned with a second centerline of the second conductive via.

11. The stacked via structure as claimed in claim 1, wherein a first centerline of the first conductive via is offset from a second centerline of the second conductive via.

12. A stacked via structure, disposed on a surface of a semiconductor die, the stacked via structure comprising:
   a first dielectric layer disposed on the semiconductor die;
   a first conductive via embedded in the first dielectric layer, wherein the first conductive via is in physical contact with the surface of the semiconductor die;
   a first redistribution wiring disposed on the first conductive via and the first dielectric layer;
   a second dielectric layer disposed on the first dielectric layer and the first redistribution wiring;

a second conductive via embedded in the second dielectric layer, wherein the second conductive via is electrically connected to the semiconductor die through the first redistribution wiring; and a second redistribution wiring disposed on the second conductive via and the second dielectric layer, wherein a first contact area of the first conductive via and the semiconductor die is greater than a second contact area of the second conductive via and the first redistribution wiring.

13. The stacked via structure as claimed in claim 12 further comprising:

a third dielectric layer disposed on the second dielectric layer and the second redistribution wiring;

a third conductive via embedded in the third dielectric layer and landed on the second redistribution wiring; and a third redistribution wiring disposed on the third conductive via and the third dielectric layer, wherein the second contact area is greater than or equal to a third contact area of the third conductive via and the second redistribution wiring.

14. The stacked via structure as claimed in claim 13 further comprising:

a fourth dielectric layer disposed on the third dielectric layer and the third redistribution wiring;

a fourth conductive via embedded in the fourth dielectric layer and landed on the third redistribution wiring; and a fourth redistribution wiring disposed on the fourth conductive via and the fourth dielectric layer, wherein the third contact area is greater than or equal to a fourth contact area of the fourth conductive via and the third redistribution wiring.

15. The stacked via structure as claimed in claim 12, wherein the first conductive via comprises tapered sidewalls or vertical sidewalls, and the second conductive via comprises tapered sidewalls or vertical sidewalls.

16. The stacked via structure as claimed in claim 12, wherein a first centerline of the first conductive via is substantially aligned with a second centerline of the second conductive via.

17. The stacked via structure as claimed in claim 12, wherein a first centerline of the first conductive via is offset from a second centerline of the second conductive via.

18. A structure, comprising:

a semiconductor die comprising conductive terminals;

conductive through vias;

an insulating encapsulation laterally encapsulating the semiconductor die and the conductive through vias;

a redistribution circuit structure, comprising:

stacked dielectric layers covering the semiconductor die and the insulating encapsulation;

a first conductive via embedded in a bottommost dielectric layer among the stacked dielectric layers, wherein the first conductive via is in physical contact with at least one of the conductive terminals or the conductive through vias;

a first redistribution wiring disposed on the first conductive via and the first dielectric layer;

a second conductive via embedded in an upper dielectric layer among the stacked dielectric layers, wherein the second conductive via is electrically connected to the at least one of the conductive terminals or the conductive through vias through the first redistribution wiring; and a second redistribution wiring disposed on the second conductive via, wherein a first lateral dimension of the first conductive via is greater than a second lateral dimension of the second conductive via.

19. The structure as claimed in claim 18, wherein a first centerline of the first conductive via is offset from a second centerline of the second conductive via.

20. The structure as claimed in claim 18, wherein a first centerline of the first conductive via is substantially aligned with a second centerline of the second conductive via.

* * * * *